(12) United States Patent
Raring et al.

(10) Patent No.: US 9,716,369 B1
(45) Date of Patent: *Jul. 25, 2017

(54) LASER PACKAGE HAVING MULTIPLE EMITTERS WITH COLOR WHEEL

(71) Applicant: Soraa Laser Diode, Inc., Goleta, CA (US)

(72) Inventors: James W. Raring, Goleta, CA (US); Paul Rudy, Goleta, CA (US); Chendong Bai, Goleta, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/047,494

(22) Filed: Feb. 18, 2016

Related U.S. Application Data

(63) Continuation of application No. 13/439,656, filed on Apr. 4, 2012, now Pat. No. 9,287,684.

(60) Provisional application No. 61/471,334, filed on Apr. 4, 2011.

(51) Int. Cl.
*H01S 5/00* (2006.01)
*H01S 5/40* (2006.01)
*H01S 5/343* (2006.01)
*H01S 5/22* (2006.01)

(52) U.S. Cl.
CPC .......... *H01S 5/4031* (2013.01); *H01S 5/2201* (2013.01); *H01S 5/34333* (2013.01); *H01S 5/4012* (2013.01)

(58) Field of Classification Search
CPC .... H01S 5/4031; H01S 5/4012; H01S 5/2201; H01S 5/34333

USPC ....................................................... 372/50.12
See application file for complete search history.

(56) References Cited

U.S. PATENT DOCUMENTS

| 4,318,058 | A | 3/1982 | Mito et al. |
| 4,341,592 | A | 7/1982 | Shortes et al. |
| 4,860,687 | A | 8/1989 | Frijlink |
| 4,911,102 | A | 3/1990 | Manabe et al. |
| 5,331,654 | A | 7/1994 | Jewell et al. |
| 5,334,277 | A | 8/1994 | Nakamura |
| 5,527,417 | A | 6/1996 | Iida et al. |
| 5,607,899 | A | 3/1997 | Yoshida et al. |
| 5,632,812 | A | 5/1997 | Hirabayashi |

(Continued)

FOREIGN PATENT DOCUMENTS

| CN | 101009347 | 3/1987 |
| CN | 1538534 | 10/2004 |

(Continued)

OTHER PUBLICATIONS

Communication from the Japanese Patent Office re 2012-011589 dated Jul. 4, 2013, 15 pages.

(Continued)

*Primary Examiner* — Tod T Van Roy
*Assistant Examiner* — Vu A Vu
(74) *Attorney, Agent, or Firm* — Kilpatrick Townsend & Stockton LLP

(57) ABSTRACT

Method and devices for emitting electromagnetic radiation at high power using nonpolar or semipolar gallium containing substrates such as GaN, AlN, InN, InGaN, AlGaN, and AlInGaN, are provided. The laser devices include multiple laser emitters integrated onto a substrate (in a module), which emit green or blue laser radiation.

20 Claims, 17 Drawing Sheets

(56) References Cited

U.S. PATENT DOCUMENTS

| | | |
|---|---|---|
| 5,647,945 A | 7/1997 | Matsuse et al. |
| 5,821,555 A | 10/1998 | Saito et al. |
| 5,888,907 A | 3/1999 | Tomoyasu et al. |
| 5,951,923 A | 9/1999 | Horie et al. |
| 6,069,394 A | 5/2000 | Hashimoto et al. |
| 6,072,197 A | 6/2000 | Horino et al. |
| 6,153,010 A | 11/2000 | Kiyoku et al. |
| 6,195,381 B1 | 2/2001 | Botez et al. |
| 6,379,985 B1 | 4/2002 | Cervantes et al. |
| 6,451,157 B1 | 9/2002 | Hubacek |
| 6,635,904 B2 | 10/2003 | Goetz et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,895,027 B2* | 5/2005 | Treusch .............. B23K 1/0008 372/109 |
| 6,920,166 B2 | 7/2005 | Akasaka et al. |
| 7,009,199 B2 | 3/2006 | Hall |
| 7,019,325 B2 | 3/2006 | Li et al. |
| 7,033,858 B2 | 4/2006 | Chai et al. |
| 7,053,413 B2 | 5/2006 | D'Evelyn et al. |
| 7,128,849 B2 | 10/2006 | Setlur et al. |
| 7,303,630 B2 | 12/2007 | Motoki et al. |
| 7,312,156 B2 | 12/2007 | Granneman et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,436,875 B2* | 10/2008 | Miura .............. G02B 6/3821 372/101 |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,284,810 B1 | 10/2012 | Sharma et al. |
| 8,294,179 B1 | 10/2012 | Raring |
| 8,314,429 B1 | 11/2012 | Raring et al. |
| 8,350,273 B2 | 1/2013 | Vielemeyer |
| 8,351,478 B2 | 1/2013 | Raring et al. |
| 8,355,418 B2 | 1/2013 | Raring et al. |
| 8,416,825 B1 | 4/2013 | Raring |
| 8,422,525 B1 | 4/2013 | Raring et al. |
| 8,427,590 B2 | 4/2013 | Raring et al. |
| 8,451,876 B1 | 5/2013 | Raring et al. |
| 8,509,275 B1 | 8/2013 | Raring et al. |
| 9,287,684 B2* | 3/2016 | Raring .............. H01S 5/34333 |
| 2001/0048114 A1 | 12/2001 | Morita et al. |
| 2002/0027933 A1 | 3/2002 | Tanabe et al. |
| 2002/0085603 A1 | 7/2002 | Okumura |
| 2002/0105986 A1 | 8/2002 | Yamasaki |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0129810 A1 | 7/2003 | Barth et al. |
| 2003/0140846 A1 | 7/2003 | Biwa et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0146264 A1 | 7/2004 | Auner et al. |
| 2004/0151222 A1 | 8/2004 | Sekine |
| 2004/0233950 A1 | 11/2004 | Furukawa et al. |
| 2004/0247275 A1 | 12/2004 | Vakhshoori et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0229855 A1 | 10/2005 | Raaijmakers |
| 2005/0230701 A1 | 10/2005 | Huang |
| 2005/0232327 A1* | 10/2005 | Nomura .............. B82Y 20/00 372/50.12 |
| 2005/0247260 A1 | 11/2005 | Shin et al. |
| 2005/0285128 A1 | 12/2005 | Scherer et al. |
| 2005/0286591 A1 | 12/2005 | Lee |
| 2006/0033009 A1 | 2/2006 | Kobayashi et al. |
| 2006/0060131 A1 | 3/2006 | Atanackovic |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0213429 A1 | 9/2006 | Motoki et al. |
| 2006/0216416 A1 | 9/2006 | Sumakeris |
| 2006/0256482 A1 | 11/2006 | Araki et al. |
| 2007/0086916 A1 | 4/2007 | LaBoeuf et al. |
| 2007/0093073 A1 | 4/2007 | Farrell et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0184637 A1 | 8/2007 | Haskell et al. |
| 2007/0217462 A1 | 9/2007 | Yamasaki |
| 2007/0241353 A1 | 10/2007 | Taki |
| 2007/0242716 A1 | 10/2007 | Samal et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0029152 A1 | 2/2008 | Milshtein et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191223 A1 | 8/2008 | Nakamura et al. |
| 2008/0198881 A1 | 8/2008 | Farrell et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |

(56) References Cited

U.S. PATENT DOCUMENTS

| | | |
|---|---|---|
| 2009/0021723 A1 | 1/2009 | De Lega |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Karkin |
| 2009/0081857 A1 | 3/2009 | Hanser et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0309110 A1 | 12/2009 | Raring et al. |
| 2009/0309127 A1* | 12/2009 | Raring ............... B82Y 10/00 257/103 |
| 2009/0310640 A1 | 12/2009 | Sato et al. |
| 2009/0316116 A1 | 12/2009 | Melville et al. |
| 2009/0321778 A1 | 12/2009 | Chen et al. |
| 2010/0001300 A1 | 1/2010 | Raring et al. |
| 2010/0006546 A1 | 1/2010 | Young et al. |
| 2010/0006873 A1 | 1/2010 | Raring et al. |
| 2010/0044718 A1 | 2/2010 | Hanser et al. |
| 2010/0054292 A1* | 3/2010 | Bessho ............... B82Y 20/00 372/49.01 |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1 | 6/2010 | Khan et al. |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0290498 A1* | 11/2010 | Hata ............... B82Y 20/00 372/50.12 |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2010/0328626 A1* | 12/2010 | Miyazaki ............... H04N 9/3114 353/85 |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0103418 A1 | 5/2011 | Hardy et al. |
| 2011/0116253 A1* | 5/2011 | Sugiyama ............... F21S 10/007 362/84 |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0188530 A1 | 8/2011 | Lell et al. |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0187371 A1 | 7/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |

FOREIGN PATENT DOCUMENTS

| | | |
|---|---|---|
| CN | 1702836 | 11/2005 |
| CN | 101079463 | 11/2007 |
| CN | 101099245 | 1/2008 |
| CN | 101171692 | 4/2008 |
| JP | 3-287770 | 12/1991 |
| JP | 07-162081 | 6/1995 |
| JP | 2002-009402 | 1/2002 |
| JP | 2002-185082 | 6/2002 |
| JP | 2004-503923 | 2/2004 |
| JP | 2004-152841 | 5/2004 |
| JP | 2004-186527 | 7/2004 |
| JP | 2006-091285 | 4/2006 |
| JP | 2006-120923 | 5/2006 |
| JP | 2007-068398 | 3/2007 |
| JP | 2007-173467 | 7/2007 |
| JP | 2007-529910 | 10/2007 |
| JP | 2008-0311640 | 12/2008 |
| JP | 2009-021506 | 1/2009 |
| JP | 2009-158893 | 7/2009 |
| JP | 2009-170708 | 7/2009 |
| WO | WO2008-041521 | 4/2008 |
| WO | 2010/120819 | 10/2010 |

OTHER PUBLICATIONS

USPTO Notice of Allowance for U.S. Appl. No. 13/853,694 dated Sep. 3, 2013, 8 pages.

Adesida et al., 'Characteristics of chemically assisted ion beam etching of gallium nitride', Applied Physics Letters, vol. 65, No. 7, 1994, pp. 889-891.

Behfar et al., 'Progress in Etched Facet Technology for GaN and Blue Lasers', Proc. of SPIE., vol. 6473, 64731F, 2007, pp. 1-8.

International Preliminary Report & Written Opinion of PCT Application No. PCT/US2011/060030 dated Mar. 21, 2012, 11 pgs. total.

USPTO Notice of Allowance for U.S. Appl. No. 12/749,466 dated Jan. 2, 2013.

USPTO Office Action for U.S. Appl. No. 12/787,343 dated Dec. 17, 2012.

USPTO Notice of Allowance for U.S. Appl. No. 12/787,343 dated Jun. 10, 2013.

USPTO Notice of Allowance for U.S. Appl. No. 12/789,303 dated Dec. 21, 2012.

USPTO Office Action for U.S. Appl. No. 12/868,441 dated Dec. 18, 2012.

USPTO Office Action for U.S. Appl. No. 13/114,806 dated Apr. 12, 2013.

USPTO Office Action for U.S. Appl. No. 13/291,922 dated Jun. 18, 2013.

USPTO Office Action for U.S. Appl. No. 13/548,635 dated Jun. 14, 2013.

USPTO Notice of Allowance for U.S. Appl. No. 13/606,894 dated May 24, 2013.

International Preliminary Report & Written Opinion of PCT Application No. PCT/US2011/037792, dated Sep. 8, 2011, 13 pages total.

Tyagi et al,. 'Semipolar (1011) InGaN/GaN Laser Diodes on Bulk GaN Substrates,' Japanese Journal of Applied Physics, vol. 46, No. 19, 2007, pp. L444-L445.

USPTO Office Action for U.S. Appl. No. 12/995,946 dated Jan. 29, 2013.

USPTO Office Action for U.S. Appl. No. 12/534,838 dated May 3, 2011.

USPTO Office Action for U.S. Appl. No. 12/534,838 dated Jan. 13, 2012.

USPTO Office Action for U.S. Appl. No. 12/534,838 dated Mar. 20, 2012.

USPTO Notice of Allowance for U.S. Appl. No. 12/534,838 dated Jun. 8, 2012.

USPTO Office Action for U.S. Appl. No. 12/859,153 dated Feb. 26, 2013.

USPTO Office Action for U.S. Appl. No. 12/942,817 dated Feb. 20, 2013.

USPTO Notice of Allowance for U.S. Appl. No. 13/108,645 dated Jan. 28, 2013.

USPTO Office Action for U.S. Appl. No. 13/291,922 dated Feb. 20, 2013.

(56) References Cited

OTHER PUBLICATIONS

USPTO Office Action for U.S. Appl. No. 13/425,354 dated Feb. 14, 2013.
USPTO Office Action for U.S. Appl. No. 13/548,312 dated Mar. 12, 2013.
USPTO Office Action for U.S. Appl. No. 13/606,894 dated Feb. 5, 2013.
Chinese Office Action From Chinese Patent Application No. 200980134723.8 dated Nov. 1, 2012, 22 pgs. (With Translation).
Franssila, 'Tools for CVD and Epitaxy', Introduction to Microfabrication, 2004, pp. 329-336.
USPTO Notice of Allowance for U.S. Appl. No. 12/762,278 dated Nov. 7, 2011.
USPTO Office Action for U.S. Appl. No. 12/789,303 dated Sep. 24, 2012.
USPTO Office Action for U.S. Appl. No. 12/859,153 dated Sep. 25, 2012.
USPTO Notice of Allowance for U.S. Appl. No. 12/883,093 dated Nov. 21, 2012.
USPTO Notice of Allowance for U.S. Appl. No. 12/884,993 dated Nov. 26, 2012.
USPTO Office Action for U.S. Appl. No. 13/354,639 dated Nov. 7, 2012.
USPTO Notice of Allowance for U.S. Appl. No. 13/354,639 dated Dec. 14, 2012.
USPTO Notice of Allowance for U.S. Appl. No. 12/502,058 dated Jul. 19, 2012.
USPTO Office Action for U.S. Appl. No. 12/749,466 dated Jul. 3, 2012.
USPTO Notice of Allowance for U.S. Appl. No. 12/749,476 dated Jun. 26, 2012.
USPTO Office Action for U.S. Appl. No. 12/759,273 dated Jun. 26, 2012.
USPTO Notice of Allowance for U.S. Appl. No. 12/762,271 dated Aug. 8, 2012.
USPTO Notice of Allowance for U.S. Appl. No. 12/880,803 dated Jul. 18, 2012.
USPTO Office Action for U.S. Appl. No. 12/883,093 dated Aug. 3, 2012.
USPTO Office Action for U.S. Appl. No. 12/884,993 dated Aug. 2, 2012.
USPTO Office Action for U.S. Appl. No. 12/995,946 dated Mar. 28, 2012.
USPTO Office Action for U.S. Appl. No. 13/046,565 dated Jul. 19, 2012.
Abare, 'Cleaved and Etched Facet Nitride Laser Diodes,' IEEE Journal of Selected Topics in Quantum Electronics, vol. 4, No. 3, 1998, pp. 505-509.
Fount A et al., 'Anisotropic Morphology of Nonpolar a-Plane GaN Quantum Dots and Quantum Wells,' Journal of Applied Physics, vol. 102, 2007, pp. 074304-1-074304-6.
Khan, 'Cleaved Cavity Optically Pumped InGaN—GaN Laser Grown on Spinel Substrates,' Applied Physics Letters, vol. 69, No. 16, 1996, pp. 2417-2420.
Lin et al., 'Influence of Separate Confinement Heterostructure Layer on Carrier Distribution in InGaAsP Laser Diodes With Nonidentical Multiple Quantum Wells,' Japanese Journal of Applied Physics, vol. 43, No. 10, 2004, pp. 7032-7035.
Okamoto et al., 'Continuous-Wave Operation of m-Plane InGaN Multiple Quantum Well Laser Diodes,' Japanese Journal of Applied Physics, vol. 46, No. 9, 2007, pp. L187-L189.
Okamoto et al., 'High-Efficiency Continuous-Wave Operation of Blue-Green Laser Diodes Based on Nonpolar mPlane Gallium Nitride,' The Japan Society of Applied Physics, Applied Physics, Express 1, 2008, pp. 072201-1-072201-3.
Park, 'Crystal Orientation Effects on Electronic Properties of Wurtzite InGaN/GaN Quantum Wells,', Journal of Applied Physics, vol. 91, No. 12, 2002, pp. 9903-9908.
Romanov et al., 'Strain-Induced Polarization in Wurtzite III-Nitride Semipolar Layers,' Journal of Applied Physics, vol. 100, 2006, pp. 023522-1 through 023522-10.
Schoedl, 'Facet Degradation of GaN Heterostructure Laser Diodes,' Journal of Applied Physics, vol. 97, issue 12, 2006, pp. 123102-1-123102-8.
Zhong et al., 'Demonstration of High Power Blue-Green Light Emitting Diode on Semipolar (1122) Bulk GaN Substrate,' Electronics Letters, vol. 43, No. 15, 2007, pp. 825-826.
USPTO Office Action for U.S. Appl. No. 12/481,543 dated Jun. 27, 2011.
USPTO Office Action for U.S. Appl. No. 12/482,440 dated Feb. 23, 2011.
USPTO Office Action for U.S. Appl. No. 12/482,440 dated Aug. 12, 2011.
USPTO Office Action for U.S. Appl. No. 12/484,924 dated Apr. 14, 2011.
USPTO Office Action for U.S. Appl. No. 12/484,924 dated Oct. 31, 2011.
USPTO Office Action for U.S. Appl. No. 12/491,169 dated Oct. 22, 2010.
USPTO Office Action for U.S. Appl. No. 12/491,169 dated May 11, 2011.
USPTO Office Action for U.S. Appl. No. 12/497,289 dated Feb. 2, 2012.
USPTO Notice of Allowance for U.S. Appl. No. 12/497,289 dated May 22, 2012.
USPTO Office Action for U.S. Appl. No. 12/502,058 dated Dec. 8, 2010.
USPTO Office Action for U.S. Appl. No. 12/502,058 dated Aug. 19, 2011.
USPTO Notice of Allowance for U.S. Appl. No. 12/502,058 dated Apr. 16, 2012.
USPTO Office Action for U.S. Appl. No. 12/534,829 dated Apr. 19, 2011.
USPTO Notice of Allowance for U.S. Appl. No. 12/534,829 dated Oct. 28, 2011.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/749,466 dated Jun. 29, 2011.
USPTO Office Action for U.S. Appl. No. 12/749,466 dated Feb. 3, 2012.
USPTO Office Action for U.S. Appl. No. 12/749,476 dated Apr. 11, 2011.
USPTO Office Action for U.S. Appl. No. 12/749,476 dated Nov. 8, 2011.
USPTO Notice of Allowance for U.S. Appl. No. 12/749,476 dated May 4, 2012.
USPTO Office Action for U.S. Appl. No. 12/759,273 dated Nov. 21, 2011.
USPTO Office Action for U.S. Appl. No. 12/762,269 dated Oct. 12, 2011.
USPTO Notice of Allowance for U.S. Appl. No. 12/762,269 dated Apr. 23, 2012.
USPTO Office Action for U.S. Appl. No. 12/762,271 dated Dec. 23, 2011.
USPTO Office Action for U.S. Appl. No. 12/762,271 dated Jun. 6, 2012.
USPTO Office Action for U.S. Appl. No. 12/778,718 dated Nov. 25, 2011.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/868,441 dated Apr. 30, 2012.

(56) References Cited

OTHER PUBLICATIONS

USPTO Office Action for U.S. Appl. No. 12/880,803 dated Feb. 22, 2012.
USPTO Office Action for U.S. Appl. No. 12/883,093 dated Mar. 13, 2012.
USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Nov. 7, 2011.
USPTO Office Action for U.S. Appl. No. 13/046,565 dated Feb. 2, 2012.
USPTO Office Action for U.S. Appl. No. 13/046,565 dated Apr. 13, 2012.
USPTO Office Action for U.S. Appl. No. 13/439,656 dated Aug. 27, 2014.
USPTO Office Action for U.S. Appl. No. 13/439,656 dated Jun. 10, 2015.
USPTO Office Action for U.S. Appl. No. 13/439,656 dated Jan. 28, 2015.
USPTO Notice of Allowance for U.S. Appl. No. 13/439,656 dated Nov. 6, 2015.

* cited by examiner

LASER PACKAGE HAVING MULTIPLE EMITTERS WITH COLOR WHEEL

CROSS-REFERENCE TO RELATED APPLICATION

This application is a continuation of U.S. application Ser. No. 13/439,656, filed Apr. 4, 2012, which claims priority to U.S. Provisional Application No. 61/471,334, filed on Apr. 4, 2011, the entire contents of both of which are incorporated by reference herein for all purposes.

BACKGROUND

The present disclosure is directed to optical devices and related methods. More specifically, the embodiments of the present disclosure provide methods and devices for emitting electromagnetic radiation at high power using nonpolar or semipolar gallium containing substrates such as GaN, AlN, InN, InGaN, AlGaN, AlInGaN, and others. The laser devices comprise multiple laser emitters integrated onto a substrate, which emit green or blue light.

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional Edison light bulb:

The conventional light bulb dissipates more than 90% of the energy used as thermal energy.

Reliability is an issue since the conventional light bulb routinely fails due to thermal expansion and contraction of the filament element.

Light bulbs emit light over a broad spectrum, much of which is not within the spectral sensitivity of the human eye.

Light bulbs emit in all directions and are not ideal for applications requiring strong directionality or focus such as projection displays, optical data storage, or specialized directed lighting.

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the efficiency, size, weight, and cost of the lasers were undesirable.

As laser technology evolved, more efficient lamp pumped solid state laser designs were developed for the red and infrared wavelengths, but these technologies remained a challenge for blue and green lasers. As a result, lamp pumped solid-state lasers were developed in the infrared, and the output wavelength was converted to the visible using specialty crystals with nonlinear optical properties. A green lamp pumped solid-state lasers had 3 stages: electricity powers lamp, lamp excites gain crystal, which lases at 1064 nm, 1064 nm goes into frequency conversion crystal, which converts, to visible 53 2 nm. The resulting green and blue lasers were called "lamped pumped solid state lasers with second harmonic generation" (LPSS with SHG) and were more efficient than Ar-ion gas lasers, but were still too inefficient, large, expensive, fragile for broad deployment outside of specialty scientific and medical applications. Additionally, the gain crystal used in the solid-state lasers typically had energy storage properties, which made the lasers difficult to modulate at high speeds, which limited its broader deployment.

To improve the efficiency of these visible lasers, high power diode (or semiconductor) lasers were utilized. These "diode pumped solid state lasers with SHG" (DPSS with SHG) had 3 stages: electricity powers a 808 nm diode laser, the 808 nm excites a gain crystal, which lases at 1064 nm, and the 1064 nm radiation is directed through a frequency conversion crystal, which converts the incident radiation to visible 532 nm radiation. The DPSS laser technology extended the life and improved the efficiency of the LPSS lasers, and further development led to additional high-end specialty industrial, medical, and scientific applications. However, the change to diode pumping increased the system cost and required precise temperature control, resulting in large LPSS lasers with power consumption, while not addressing energy storage properties, which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost, and size compared to DPSS-SHG lasers, however, the specialty diodes and crystals required make this challenging. Additionally, although the diode-SHG lasers have the benefit of being directly modulate-able, they suffer from severe sensitivity to temperature, which limits their application.

High power direct diode lasers have been in existence for the past few decades, beginning with laser diodes based on the GaAs material system, then moving to the AlGaAsP and InP material systems. More recently, high power lasers based on GaN operating in the short wavelength, visible regime have become of interest. More specifically, laser diodes operating in the violet, blue, and eventually green regimes are attracting attention due to their application in optical storage and display systems. Currently, high power laser diodes operating in these wavelength regimes are based on polar c-plane GaN. The conventional polar GaN based laser diodes have a number of applications, but unfortunately, device performance is often inadequate.

BRIEF SUMMARY

In certain embodiments provided by the present disclosure, bar laser devices are configured with multiple emitters using either a semipolar or a non-polar gallium nitride surface configuration. A bar laser device can be configured for efficient and reliable operation using multiple package configurations, including open, environmentally sealed, and/ or hermetically sealed configurations. Conventional laser devices, in contrast, are limited to use with hermetically sealed packages due to issues of reliability and/or efficiency.

In certain embodiments, a laser bar device is substantially free from aluminum bearing cladding materials, which facilitates high temperature and/or high power operation without degradation. Other aspects of the disclosed bar devices include c+ and c− oriented facets. In certain embodiments, a bar device includes a substantially uncoated or slightly coated facet and a mirrored facet for each of the laser devices. In certain embodiments, a laser bar can output a broad electromagnetic spectrum for use in general lighting or other suitable applications.

Certain embodiments provided by the present disclosure comprise a laser bar with an array of gallium and nitrogen containing laser devices having plural emitters. In certain embodiments, the emitters are configured to be operable within a broad spectral output greater than 0.5 nm FWHM, e.g., 1 nm, 2 nm, 3 nm, 4 nm, 6 nm and in certain embodiments, greater than 6 nm. The laser devices are formed on either a non-polar or semi-polar oriented surface, and each has a c+ facet region and a c− facet region. The devices also have common p-side and n-side electrodes coupling each of the laser devices. In certain embodiments, the c+ facet is exposed for a laser device configured on a non-polar m-plane gallium containing substrate. For semi-polar substrates, the laser stripe can be oriented in substantially a projection of the c-direction, and the cleaved facets are configured substantially orthogonal to the laser stripe and off-angle to the c-plane.

In certain embodiments, a laser bar device is in an environmentally or hermetically sealed container, or is an open package having a mean time to failure of 1000-5000 hours or more. The open environment can include air, inert gas, or other environments. Each of the emitter regions emits electromagnetic radiation ranging from about 430 nm to about 480 nm or 510 to 550 nm.

In certain embodiments, a substrate has a front side and a back side. Each of the laser devices is a ridge laser device arranged in parallel from 1 through N, where N is an integer of 3 and greater. A bar device also has a plurality of N emitters provided respectively for each of the plurality of laser devices. The plurality of N emitters is characterized by an average operating power of at least 25 mWatts. At least one electrode is coupled to each of the plurality of N emitters. The structure also includes an optical device for optically combining emitted electromagnetic radiation from the emitters.

In certain embodiments, a device includes a plurality of laser beams formed into a single laser beam is operable above 4 W of continuous wave output power. In certain embodiments, the plurality of laser beams formed into a single laser beam is operable above 15 W of continuous wave output power. In certain embodiments, the plurality of laser beams formed into a single laser beam is operable above 25 W of continuous wave output power. In certain embodiments, the plurality of optical devices to optically couple the plurality of laser beams into a single beam comprises at least one of fast access collimators, slow axis collimators, and dichroic mirrors. In certain embodiments, the plurality of laser beams formed into a single laser beam is optically coupled into an optical fiber. In certain embodiments, the plurality of laser beams formed into a single laser beam comprises a spectral FWHM of greater than 2 nm. In certain embodiments, the plurality of laser beams formed into a single laser beam comprises a spectral FWHM of greater than 4 nm. In certain embodiments, the plurality of laser beams formed into a single laser beam comprises a spectral FWHM of greater than 6 nm. In certain embodiments, the device also includes a plurality of phosphor materials configured to interact with electromagnetic radiation emitted from at least one of the plurality of laser devices.

Devices provided by the present disclosure enable cost-effective optical devices for laser applications. The devices can be manufactured in a relatively simple cost-effective manner. Depending upon the embodiment, the devices can be manufactured using conventional materials and/or methods. The laser devices are capable of emitting long wavelengths ranging from 430 nm to greater than about 600 nm. The laser devices can be used in multiple package designs facilitated by a laser structure configured to be substantially free from aluminum bearing species in cladding layers within the vicinity of the active region. In certain embodiments, the active region is free from aluminum bearing species, although there may be aluminum within an electron blocking region or optical blocking region. A further understanding of the nature and advantages of embodiments provided by the present disclosure may be realized by reference to the specification and attached drawings.

DETAILED DESCRIPTION

Figure 1:
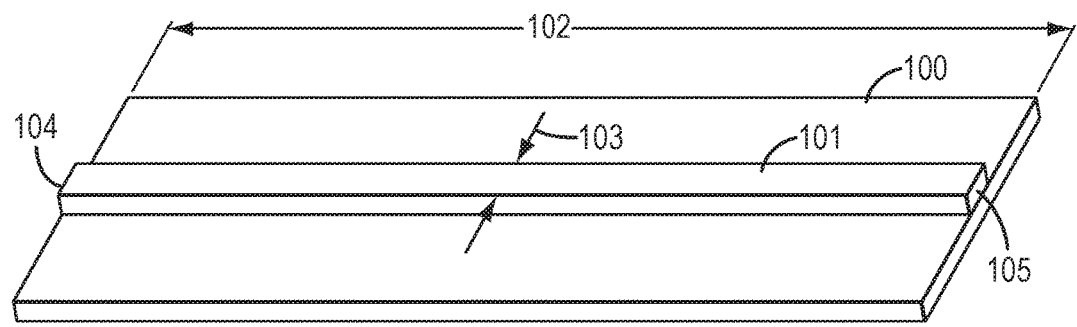
FIG. 1 is a diagram illustrating an optical device according to certain embodiment.

Certain embodiments provided by the present disclosure high power GaN-based laser devices and the methods for making and using these laser devices. Specifically, laser devices are configured to operate with 0.5 to 5 W or 5 to 20 W or higher output power in the blue or green wavelength regimes. In certain embodiments, laser devices are manufactured from bulk nonpolar or semipolar gallium and nitrogen containing substrates. As mentioned above, the output wavelength of the laser devices can be in the blue wavelength region of 430-480 nm and in the green wavelength region 500-545 nm. It is to be appreciated that laser devices according to embodiments of the present disclosure can also operate in wavelengths such as violet (395 to 425 nm) and blue-green (475-505 nm). The laser devices can be used in various applications, such as in projection systems where high power laser are used to illuminate images and videos.

Certain projectors using a laser pumped phosphor design were first commercialized in 2010 by Casio in the 1000-3000 lumen regime for education, board rooms, entertainment, and other applications. The laser-phosphor design approach has the advantage of long reliability (>10 k hour lifetime) due to the use of reliable laser diode technology, and therefore favorably compares to prior designs, which utilized bulky, inefficient, and unreliable lamps (<2000 hour lifetime). Moreover, the laser phosphor approach is superior to other potential designs such as LEDs because the laser-phosphor approach directs high power laser light (20 watts to 40 watts of optical) onto a small spot on a phosphor (1 mm to 2 mm diameter), that results in visible light generation that has high spatial brightness and that can then be collimated efficiently to illuminate a display generating chip (DLP and LCOS panels) to produce images. Because LEDs are more extended sources with roughly 1-2 watts per $mm^2$ output, it is not possible to focus 20-40 watts of LED optical emission onto a small 1 mm spot and then collimate the light efficiently to illuminate a display generating chip (i.e., DLP and LCOS panels) to produce images.

Limitations exist with conventional laser-phosphor designs. That is, the laser-phosphor designs utilize a large number of individually packaged laser diode devices (20-30 devices) and external lenses and mirrors to steer and focus the 20-30 beams onto a spot on the phosphor. This approach is practical because it utilizes the individually mounted laser diodes, which are available in packages ("TO-can packages" such as TO-56 and TO-9) that have been utilized in the optical storage and telecommunications markets and other specialty laser markets. The approach of using individually packaged devices has substantial challenges, which we have discovered:

The cost is high for this approach since each of the 20-30 laser emitters has its own hermetically sealed package, and an individual lens is actively aligned and affixed to each laser package, and then steered with additional mirrors and optics onto the phosphor.

High cost is also required in the assembly process because, great care, substantial alignment time, and high precision tooling must be utilized so that each beam is collimated and steered onto the phosphor, and that each beam is positioned relative to all of the other beams in order to deliver the desired spot onto the phosphor with the desired pattern and uniformity.

High cost is required since the individually packaged laser cans are designed so that the collimating optics can only be positioned far from the chip at the outside of the window of the can, and because the mechanical tolerances of each package are too high to allow for a monolithic lens or alignment approach of multiple optics to multiple lasers at one time.

The projector form factor is large because the laser diodes are mounted independently on TO-can packages, and the packages are then mounted in a larger assembly in which the fins are cooled with fans. This can drive the height of the projector to be larger than otherwise necessary (i.e., 2" or more), reducing the slim profile and functionality, which is desired by consumers who desire portability.

Projector efficiency and reliability are a challenge since typically, the beam spot on the phosphor is not uniform and has hot spots with high intensity, and the phosphor can overheat locally causing substantial reduction in emission and lifetime. In extreme cases, the phosphor can be burned causing catastrophic damage to the projector.

Projector efficiency and cost are also a challenge since the pattern of the laser spot is not matched to the geometry of the display generating chip, then beam from the phosphor needs to be expanded to overfill the display generating chip resulting in substantial light loss (as much as 50% loss).

Projector reliability is challenging due to the thermal aspects of this design approach since the lasers are mounted independently on TO-can packages, and the thermal path has substantial resistance between the active region of the laser diode chip and the case of the packaged device (10-20° C. per Watt). The packages are then mounted in a larger assembly whose fins are cooled with fans. This design causes the laser active area to operate at high temperatures, which decreases their efficiency and results in more heat generation and higher costs and reduced reliability. Operating temperatures for the laser case is limited to 50° C., which makes it difficult for the projectors to operate in hot environments such as emerging countries schools where air conditioning is not available. These and other limitations may be overcome by the present system and apparatus, which will be further described below.

FIG. 1 is a diagram illustrating an optical device. The optical device includes a gallium nitride substrate member 100 having a crystalline surface region characterized by a semipolar or nonpolar orientation. The bulk GaN substrate preferably has a surface dislocation density below $10^5$ $cm^{-2}$ or 10E5 to 10E7 $cm^{-2}$. The nitride crystal or wafer may comprise $Al_xIn_yGa_{1-x-y}N$, where 0≤x, y, x+y≤1. The GaN substrate has threading dislocations at a concentration between about $10^5$ $cm^{-2}$ and about $10^8$ $cm^{-2}$ in a direction that is substantially orthogonal or oblique with respect to the surface. The GaN substrate is characterized by a nonpolar orientation (e.g., m-plane), where waveguides are oriented in the c-direction or substantially orthogonal to the a-direction.

In certain embodiments, the GaN surface orientation is substantially in the {20-21} orientation, and the device has a laser stripe region 101 formed overlying a portion of the off-cut crystalline orientation surface region. Laser stripe region 101 has a width 103 and a length 102. For example, the laser stripe region is characterized by a cavity orientation substantially in a projection of a c-direction, which is substantially normal to an a-direction. In certain embodiments, the laser stripe region has a first end 104 and a second end 105. In certain embodiments, the device is formed on a projection of a c-direction on a {20-21} or an offcut of a {20-21} gallium and nitrogen containing substrate having a pair of cleaved mirror structures, which face each other.

In certain embodiments, a device has a first cleaved facet provided on the first end 104 of the laser stripe region and a second cleaved facet provided on the second end 105 of the laser stripe region 101. The first cleaved facet is substantially parallel with the second cleaved facet. Mirror surfaces are formed on each of the cleaved facets. The first cleaved facet provides a first mirror surface by a top-side skip-scribe scribing and breaking process. The scribing process can use any suitable technique, such as a diamond scribe or laser scribe. In certain embodiments, the first mirror surface has a reflective coating selected from silicon dioxide, hafnia, and titania, tantalum pentoxide, zirconia, or combinations of any of the foregoing. Depending upon the embodiment, the first mirror surface can also have an anti-reflective coating.

Also, in certain embodiments, the second cleaved facet provides a second mirror surface by a top side skip-scribe scribing and breaking process. In certain embodiments, the scribing is diamond scribed or laser scribed. In certain embodiments, the second mirror surface comprises a reflective coating as described for the first surface.

In certain embodiments where the device is formed on a nonpolar Ga-containing substrate, the device is characterized by spontaneously emitted light polarized substantially perpendicular to the c-direction. The light has a polarization ratio of greater than about 0.1 to about 1 perpendicular to the c-direction, and a wavelength ranging from about 430 nanometers to about 480 nanometers (blue), and in certain embodiments, from about 500 nanometers to about 540 nanometers (green). The spontaneously emitted light is highly polarized and has a polarization ratio of greater than 0.4. In certain embodiments where the device is formed on a semipolar {20-21} Ga-containing substrate, the device is characterized by spontaneously emitted light polarized substantially parallel to the a-direction, and in certain embodiments, perpendicular to the cavity direction, which is oriented in the projection of the c-direction.

In certain embodiments, the present disclosure provides an alternative device structure capable of emitting light having a wavelength of 501 nm and greater in a ridge laser embodiment. In certain embodiments, a device is provided with one or more of the following epitaxially grown elements:

an n-GaN cladding layer with a thickness from 100 nm to 3000 nm with Si doping level of 5E17 $cm^{-3}$ to 3E18 $cm^{-3}$;

an n-side SCH layer comprised of InGaN with a molar fraction of indium between 2% and 10% and a thickness from 20 to 200 nm;

multiple quantum well active region layers comprising at least two 2.0 nm to 8.5 nm thick InGaN quantum wells separated by GaN or InGaN barrier layers having a thickness of 1.5 nm and greater, and in certain embodiments, up to about 12 nm thick;

optionally, a p-side SCH layer comprising InGaN with a molar fraction of indium of between 1% and 10% and a thickness from 15 nm to 100 nm, or an upper GaN-guide layer;

an electron blocking layer comprising AlGaN with a molar fraction of aluminum between 6% and 22% and a thickness from 5 nm to 20 nm, and doped with Mg.

a p-GaN cladding layer with a thickness from 400 nm to 1000 nm with a Mg doping level of 2E17 $cm^{-3}$ to 2E19 $cm^{-3}$; and a p++-GaN contact layer with a thickness from 20 nm to 40 nm with a Mg doping level of 1E19 $cm^{-3}$ to 1E21 $cm^{-3}$.

In certain embodiments, the laser devices are free from aluminum bearing cladding layers and/or free from aluminum bearing cladding positioned in the vicinity of the light emitting quantum well layers. In certain embodiments, a device will not contain aluminum bearing cladding layers within 500 nm to 150 nm of the quantum well layers where the optical field intensity in the laser mode is very high. In certain embodiments, devices provided by the present disclosure are believed to prevent detrimental characteristics of high temperature operation of the laser device.

Figure 2:
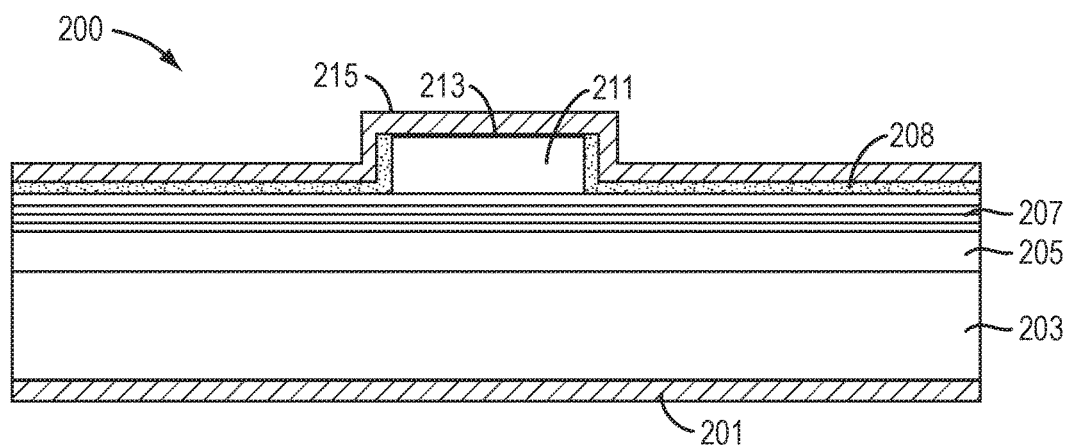
FIG. 2 is a cross-sectional view of a laser device fabricated according to certain embodiments.

FIG. 2 is a cross-sectional view of a laser device 200. As shown in FIG. 2, the laser device includes a gallium nitride substrate 203, which has an underlying n-type metal back contact region 201. The device also has an overlying n-type gallium nitride layer 205, an active region 207, and an overlying p-type gallium nitride layer structured as a laser stripe region 211. Each of these regions is formed using an epitaxial deposition technique of metal organic chemical vapor deposition (MOCVD), molecular beam epitaxy (MBE), or other epitaxial growth techniques suitable for GaN growth. In certain embodiments, the epitaxial layer is a high quality epitaxial layer overlying the n-type gallium nitride layer. In certain embodiments, the high quality layer is doped, for example, with Si or O to form n-type material, with a dopant concentration between about $10^{16}$ $cm^{-3}$ and $10^{20}$ $cm^{-3}$.

In certain embodiments, an n-type $Al_uIn_vGa_{1-u-v}N$ layer, where 0≤u, v, u+v≤1, is deposited on the substrate. The carrier concentration may be from about $10^{16}$ $cm^{-3}$ and $10^{20}$ $cm^{-3}$. The deposition may be performed using metalorganic chemical vapor deposition (MOCVD) or molecular beam epitaxy (MBE).

To fabricate a device, a bulk GaN substrate can be placed on a susceptor in an MOCVD reactor. After closing, evacuating, and back-filling the reactor (or using a load lock configuration) to atmospheric pressure, the susceptor can be heated to a temperature between about 900° C. to about 1200° C. in the presence of a nitrogen-containing gas. In certain embodiments, the susceptor is heated to approximately 900° C. to 1200° C. under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the Group V precursor (ammonia) to that of the Group III precursor (trimethylgallium, triethylgallium, trimethylindium, trimethylaluminum) during growth is between about 2000 and about 12000 sccm. A flow of disilane in a carrier gas, with a total flow rate of between about 0.1 and 10 sccm, is initiated.

In certain embodiments, the laser stripe region comprising a p-type gallium nitride layer 211 is made with an etching process, such as dry etching, or wet etching. The dry etching process is an inductively coupled process using chlorine bearing species or a reactive ion etching process using similar chemistries. The device also has an overlying dielectric region 208, which is etched to expose contact region 213. In certain embodiments, the dielectric region 208 is an oxide such as silicon dioxide or silicon nitride. The contact region 213 is coupled to an overlying metal layer 215. The overlying metal layer can be a multilayered structure containing gold and platinum (Pt/Au), nickel gold (Ni/Au).

The laser device has active region 207, which can include one to ten quantum well regions or a double heterostructure region for light emission. As an example, following deposition of the n-type $Al_uIn_vGa_{1-u-v}N$ layer for a predetermined period of time, so as to achieve a predetermined thickness, an active layer is deposited with 2-10 quantum wells. The quantum wells comprise InGaN with GaN, AlGaN, InAlGaN, or InGaN barrier layers separating the quantum wells. In certain embodiments, the quantum well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where $w<u$, y and/or $x>v$, z so that the bandgap of the quantum well layer(s) is less than that of the barrier layer(s) and the n-type layer. In certain embodiments, the quantum well layers and barrier layers each have a thickness between about 1 nm and about 20 nm. The composition and structure of the active layer are chosen to provide light emission at a preselected wavelength. The active layer may be left undoped (or unintentionally doped) or may be n-type doped or p-type doped.

In certain embodiments, the active region can also include an electron blocking region and/or a separate confinement heterostructure. The electron-blocking layer may comprise $Al_sIn_tGa_{1-s-t}N$, where $0 \leq s, t, s+t \leq 1$, with a higher bandgap than the active layer, and may be doped p-type. In certain embodiments, the electron blocking layer comprises AlGaN. In certain embodiments, the electron blocking layer comprises an AlGaN/GaN super-lattice structure with alternating layers of AlGaN and GaN, each layer having a thickness between about 0.2 nm and about 5 nm.

As noted, the p-type gallium nitride structure is deposited above the electron blocking layer and active layer(s). The p-type layer is doped with Mg, to a level between about $10^{16}$ $cm^{-3}$ and $10^{22}$ $cm^{-3}$, and has a thickness between about 5 nm and about 1000 nm. The outermost 1 nm to 50 nm of the p-type layer is doped more heavily than the rest of the layer, so as to enable an improved electrical contact. The laser stripe is obtained by an etching process, such as dry etching. In certain embodiments, the device also has an overlying dielectric region, e.g., silicon dioxide, which exposes contact region 213.

In certain embodiments, electrical contact region 213 can be a reflective electrical contact. In certain embodiments, a reflective electrical contact comprises silver, gold, aluminum, nickel, platinum, rhodium, palladium, chromium, or the like. is the reflective electrical contact can be deposited by thermal evaporation, electron beam evaporation, electroplating, sputtering, or another suitable technique. In certain embodiments, the electrical contact serves as a p-type electrode for the optical device. In certain embodiments, the electrical contact serves as an n-type electrode for the optical device.

The laser devices illustrated in FIG. 1 and FIG. 2 and described above are typically suitable for relative low-power applications, but in certain embodiments can also provide high-power laser devices with multiple emitters. High power embodiments can be provided diode laser is by widening one or more portions of the laser cavity member from the single lateral mode regime of 1.0 μm to 3.0 μm to the multi-lateral mode range of 5.0 μm to 20 μm. In certain embodiments, laser diodes having cavities with a width of 50 μm or greater are employed.

In certain embodiments, the laser stripe length, or cavity length ranges from 300 μm to 3000 μm and is fabricated using growth and fabrication techniques described in U.S. Publication No. 2010/0316075, which is incorporated by reference herein for all purposes. As an example, laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is lighter on nonpolar and semipolar substrates, such that better gain properties from the lasers can be achieved.

One difficulty with fabricating high-power GaN-based lasers with wide cavity designs is a phenomenon in which the optical field profile in the lateral direction of the cavity becomes asymmetric such that there are local bright regions and local dim regions. Such behavior is often referred to as filamenting and can be induced by lateral variations in the index of refraction or thermal profile which alters the mode guiding characteristics. Such behavior can also be a result of non-uniformities in the local gain/loss caused by non-uniform injection of carriers into the active region or current crowding where current is preferentially conducted through the outer regions of the laser cavity. That is, the current injected through the p-side electrode tends toward the edge of the etched p-cladding ridge/stripe required for lateral waveguiding, and is then conducted downward where the holes recombine with electrons primarily near the side of the stripe. Regardless of the cause, such filamenting or non-symmetric optical field profiles can lead to degraded laser performance as the stripe width is increased.

Figure 3:
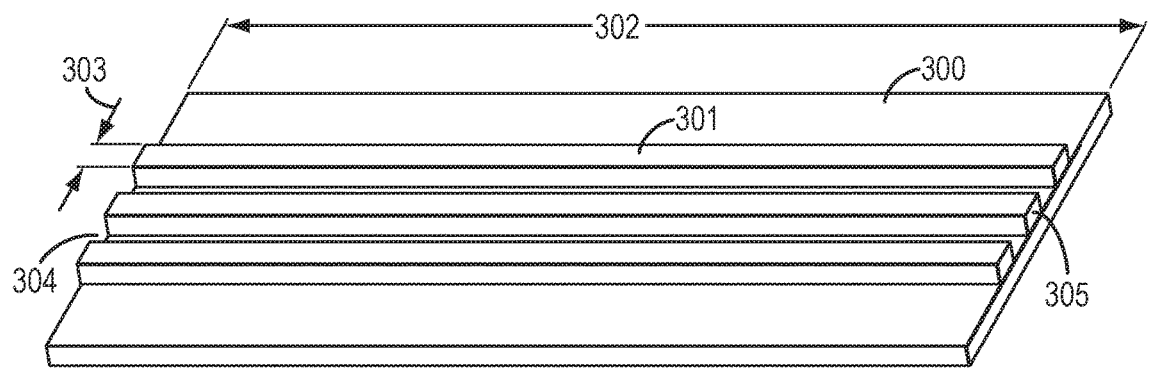
FIG. 3 is a diagram illustrating a laser device having a plurality of emitters according to certain embodiments.

FIG. 3 is a diagram illustrating a laser device having a plurality of emitters according to certain embodiments. As shown in FIG. 3, a laser device comprises a substrate and a plurality of emitters. Each cavity member, in conjunction with the underlying active region within the substrate and other electrical components, is a part of a laser diode. The laser device in FIG. 3 includes three laser diodes, each having its emitter or cavity member (e.g., cavity member 301 functions a waveguide of a laser diode) and sharing the substrate 300, which contains active regions. In various embodiments, the active regions include quantum wells or a double hetereostructure for light emission. The cavity members function as waveguides for the laser device. Devices with multiple cavity members integrated on a single substrate and the method of manufacturing thereof are described in the U.S. Publication No. 2010/0302464, which is hereby incorporated by reference for all purposes.

The substrate shown in FIG. 3 contains gallium and nitrogen material, being fabricated from nonpolar or semipolar bulk GaN substrate. The cavity members as shown are arranged in parallel to one another. Cavity member 301 comprises a front mirror 305 and a back mirror 304, similar to the cavity member 101 illustrated in FIG. 1, and as described above. A number of laser cavity members are positioned adjacent to one another. Each of the laser cavities is characterized by a cavity width 303, w, ranging from about 1 μm to about 6 μm or 6 μm to about 12 μm. It is to be appreciated that such an arrangement of cavity members increases the effective stripe width while assuring that the cavity members are uniformly pumped. The cavity members are characterized by a substantially equal length 302 and width 303.

Depending on the application, a high power laser device can have a number of cavity members, n, which can range from 2 to 5, 10, or even 20. The lateral spacing, or the distance separating one cavity member from another, can range from 2 μm to 25 μm or larger, depending upon the requirements of the laser diode. In various embodiments, the length of the cavity members can range from 300 μm to 2000 μm, and in some cases as much as 3000 μm.

In certain embodiments, laser emitters (e.g., cavity members) are arranged as a linear array on a single chip. The laser emitters are configured to emit blue or green laser radiation.

As shown, emitters are substantially parallel to one another, and they can be separated by 3 µm to 15 µm, by 15 µm to 7 µm, by 75 µm to 150 µm, by 150 µm to 300 µm, by 300 µm to 500 µm, or by 500 µm to 1000 µm. The number of emitters in the array can vary from 3 to 15, from 15 to 30, from 30 to 50, from 50 to 100, or more than 100. Each emitter may produce an average output power of 25 mW to 50 mW, 50 mW to 100 mW, 100 mW to 250 mW, 250 mW to 500 mW, 500 mW to 1000 mW, or greater than 1 W. Thus the total output power of the laser device having multiple emitters can range from 200 mW to 500 mW, from 500 mW to 1000 mW, from 1 W to 2 W, from 2 W to 5 W, from 5 W to 10 W, from 10 W to ~20 W, and greater than 20 W. The widths of the individual emitters can be from 1.0 µm to 3.0 µm, from 3.0 µm to 6.0 µm, from 6.0 to 10.0 µm, from 10 µm to 20.0 µm, and in certain embodiments, greater than 20 µm. The lengths of the emitters can range from 400 µm to 800 µm, from 800 µm to 1200 µm, from 1200 µm to 1600 µm, or in certain embodiments, greater than 1600 µm.

The cavity member has a front end and a back end. The laser device is configured to emit laser radiation through the front mirror at the front end. The front end can have an anti-reflective coating or no coating 1, thereby allowing radiation to pass through the mirror without excessive reflectivity. Since substantially no laser radiation is to be emitted from the back end of the cavity member, the back mirror is configured to reflect the radiation back into the cavity. The back mirror has a highly reflective coating with a reflectivity greater than 85%.

Figure 4:
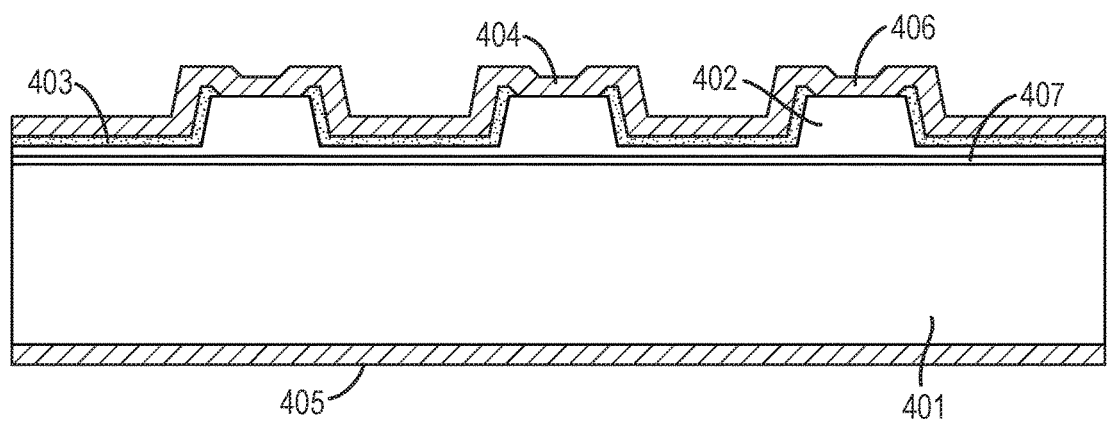
FIG. 4 is a diagram illustrating a front view of a laser device with multiple cavity members.

FIG. 4 is a diagram illustrating a front view of a laser device with multiple cavity members. As shown in FIG. 4, a laser device includes an active region 407 positioned on the substrate 401. The cavity member 402 includes a via 406. Vias 406 are provided on the cavity members 402 and opened in a dielectric layer 403. The top of the cavity members with vias form laser ridges, which expose electrode 404 for an electrical contact. The electrode 404 comprises a p-type electrode. In certain embodiments, a common p-type electrode is deposited over the cavity members and dielectric layer 403, as illustrated in FIG. 4.

The cavity members are electrically coupled to each other by the electrode 404. The laser diodes, each having an electrical contact through its cavity member, share a common n-side electrode. Depending on the application, the n-side electrode can be electrically coupled to the cavity members in different configurations. In certain embodiments, the common n-side electrode is electrically coupled to the bottom side of the substrate. In another embodiment, the n-contact is on the top of the substrate, and the connection is formed by etching deep down into the substrate from the top and then depositing metal contacts. If the laser diodes are electrically coupled to one another in a parallel configuration when current is applied to the electrodes, all laser cavities can be pumped relatively equally. Since the ridge widths will be relatively narrow such as, for example, from 1.0 µm to 5.0 µm, the center of a cavity member will be in close vicinity to the edges of the ridge (e.g., the via) such that current crowding or non-uniform injection will be mitigated. Most importantly, filamenting can be prevented and the lateral optical field profile can be symmetric in such narrow cavities.

It is to be appreciated that the laser device with multiple cavity members has an effective ridge width of n×w, which could easily approach the width of conventional high power lasers having a width in the 10 µm to 50 µm range. Typical lengths of laser bar devices provided by the present disclosure can range from 400 µm to 2000 µm, and can be as much as 3000 µm. A schematic illustration of a conventional single stripe narrow ridge emitter intended for lower power applications of 5 mW to 500 mW is shown in FIG. 1. A schematic diagram of a bar emitter as an example of laser devices with multiple cavity members intended for operation powers of 0.5 W to 10 W is shown in FIG. 2.

Figure 5A:
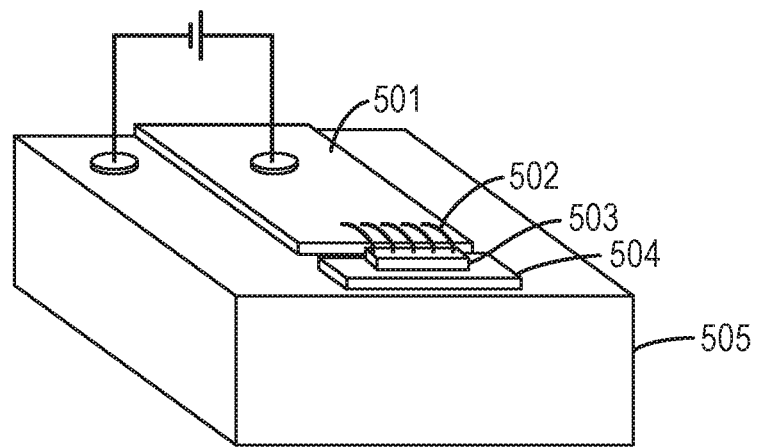
FIG. 5A and FIG. 5B illustrate laser devices according to certain embodiments.
Figure 5B:
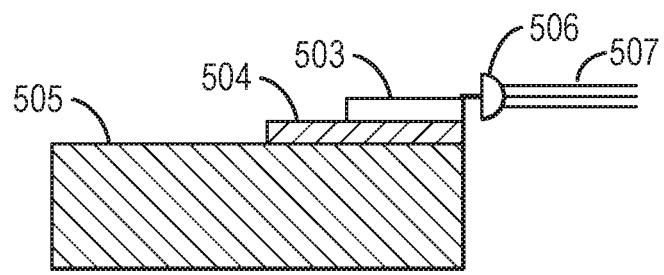

The laser devices illustrated in FIG. 3 and in FIG. 4 have a wide range of applications. For example, the laser devices can operate at a power level of 0.5 W to 10 W or greater. The operating voltage can be less than 5 volts to 7 volts. A typical application of the laser devices is to emit a single ray of laser light. For a laser device having multiple emitters, an optical member is used to combine or collimate output from the multiple emitters. FIG. 5A and FIG. 5B are diagrams illustrating a laser package having "p-side" facing up according to certain embodiments.

As shown in FIG. 5A, a laser bar is mounted on a submount. The laser bar comprises an array of emitters (e.g., as illustrated in FIG. 3 and FIG. 4). In certain embodiments, the laser bar comprises a substrate having a semipolar or non-polar orientation. In certain embodiments, the laser bar is attached to the submount, which is positioned between the laser bar and a heat sink. The submount allows the laser bar to be securely attached to the heat sink, such as a copper heat sink. In certain embodiments, a submount can also be aluminum nitride having a thermal conductivity over 200 W/(mk). Other types of materials can also be used for a submount such as diamond, composite diamond, copper tungsten alloy, or beryllium oxide. In certain embodiments, the submount material compensates for a coefficient of thermal expansion (CTE) mismatch between the laser bar and the heat sink.

In FIG. 5A, the "p-side" (i.e., the side with the emitters) of the laser bar faces upward and thus is not coupled to the submount. The p-side of the laser bar is electrically coupled to the anode of a power source through a number of bonding wires. Since both the submount and the heat sink can be conductive, the cathode of the power source can be electrically coupled to the other side of the laser bar through the submount and the heat sink.

In certain embodiments, the array of emitters can be manufactured from a gallium nitride substrate. The substrate has a surface characterized by a semi-polar or non-polar orientation. The gallium nitride material allows the laser device to be packaged without hermetic sealing. More specifically, by using the gallium nitride material, the laser bar is substantially free from AlGaN and/or high Ga-content InAlGaN cladding layers, substantially free from p-type AlGaN and/or high Ga-content InAlGaN cladding layers, or substantially free from aluminum bearing layers within the cladding in the vicinity of the quantum well light emitting layers. Typically, AlGaN and/or InAlGaN cladding layers are unstable when operating in normal atmosphere, as they interact with oxygen. To address this problem, conventional laser devices with AlGaN and/or InAlGaN material are hermetically sealed to prevent interaction between the AlGaN and/or InAlGaN and air. In contrast, because AlGaN and/or InAlGaN claddings are not present in laser devices according to certain embodiments provided by the present disclosure, the laser devices do not need to be hermetically packaged. This reduces the cost of manufacturing, FIG. 5B is a side view diagram of the laser device illustrated in FIG. 5A. As shown, the laser bar 503 is mounted on a submount 504, and the submount 504 is mounted on a heat sink 505. Power is applied to laser 503 from anode 501 through wire bonds 502, and the cathode is electrically coupled to heat sink 505. Because the laser bar 503 comprises a number of emitters, a collimating lens 506 is used to combine the emitted laser radiation to form a single laser beam 507. In certain embodiments, the collimating lens 506 is a fast-axis collimating (FAC) lens that is characterized by a cylindrical shape.

Figure 6A:
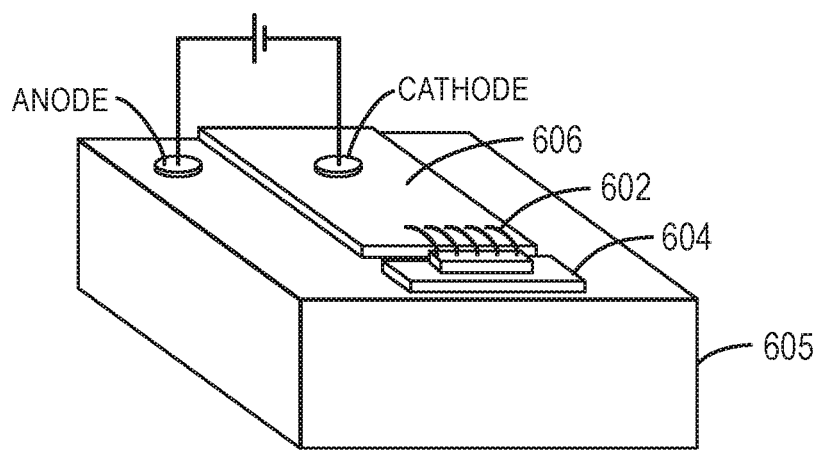
FIG. 6A and FIG. 6B are diagrams illustrating a laser package having "p-side" facing down according to certain embodiments.
Figure 6B:
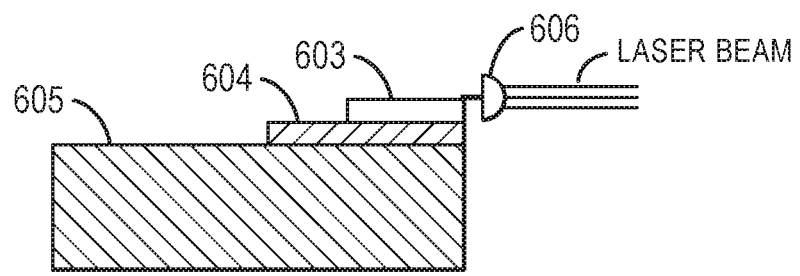

FIG. 6A and FIG. 6B are diagrams illustrating a laser package having "p-side" facing down and thus is directly coupled to the submount. The p-side of the laser bar 603 is electrically coupled to the anode of a power source through the submount 604 and/or the heat sink 605. The other side of the laser bar is electrically coupled to the cathode 601 of the power source through bonding wires 602. FIG. 6B is a side view diagram of the laser device illustrated in FIG. 6A. As shown, the laser bar is mounted on the submount, and the submount is mounted on the heat sink. A collimating lens 606 is used to combine the emitted laser radiation to form a single laser beam 607.

Figure 7:
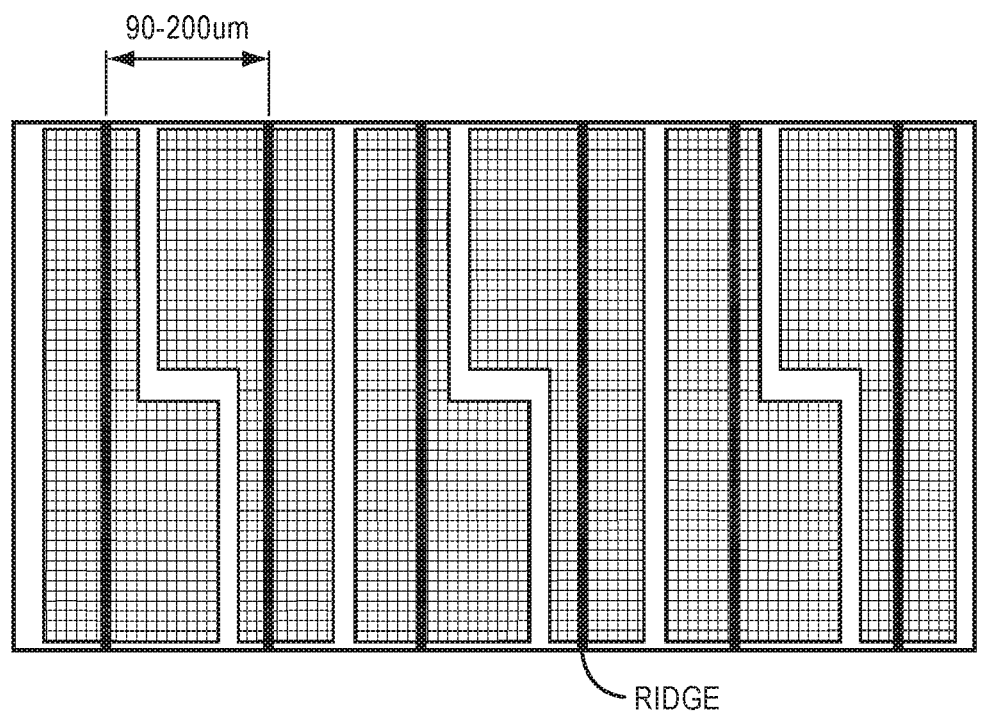
FIG. 7 is a diagram illustrating an individually addressable laser package according to certain embodiments.

FIG. 7 is a diagram illustrating an individually addressable laser package according to certain embodiments. As shown in FIG. 7, a laser bar comprises a number of emitters separated by ridge structures with each of the emitters having a width of about 90 μm to 200 μm. Each of the laser emitters includes a pad for p-contact wire bonding. It is to be appreciated that the configuration shown in FIG. 7 in which the lasers are individually addressable increases the yield by allowing non-functional lasers to be off. In certain embodiments, a control module is electrically coupled to each laser for individually controlling devices of the laser bar.

Figure 8:
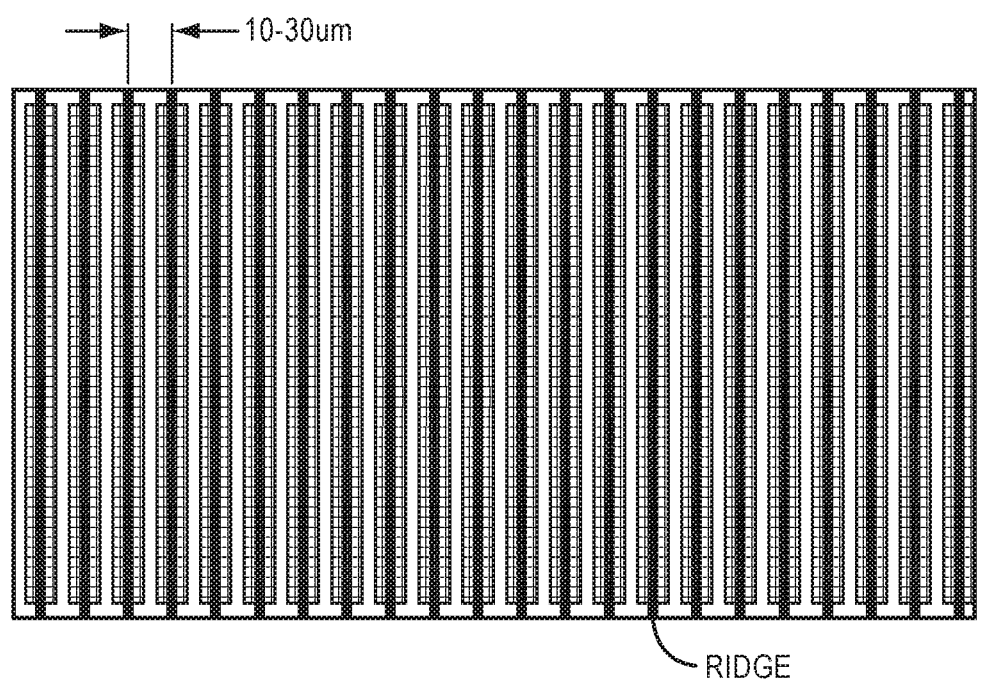
FIG. 8 is a diagram illustrating a laser bar having a patterned bonding substrate according to certain embodiments.

FIG. 8 is a diagram illustrating a laser bar having a patterned bonding substrate. As shown, laser devices are characterized by a width of around 30 μm. Laser emitters having pitches smaller than about 90 μm are difficult to connect to using wire bonds. In certain embodiments, a patterned bonding substrate is used for forming contacts. For example, the pattern bonding substrates allows for the width to be as low as 10 μm to 30 μm.

Laser bars integrating multiple laser emitters provide numerous performance advantages. In certain embodiments, single-mode emitters are integrated in a single laser bar. The emitters are manufactured from a single substrate. The emitters are arranged in parallel as shown in FIG. 3, and the emitters form a 5 mm linear laser diode array. In certain embodiments, a laser bar is characterized by a 4 W CW operating power and 200 μm pitch. In certain embodiments, a laser bar is coupled to a 1-inch thick copper mount.

Figure 9:
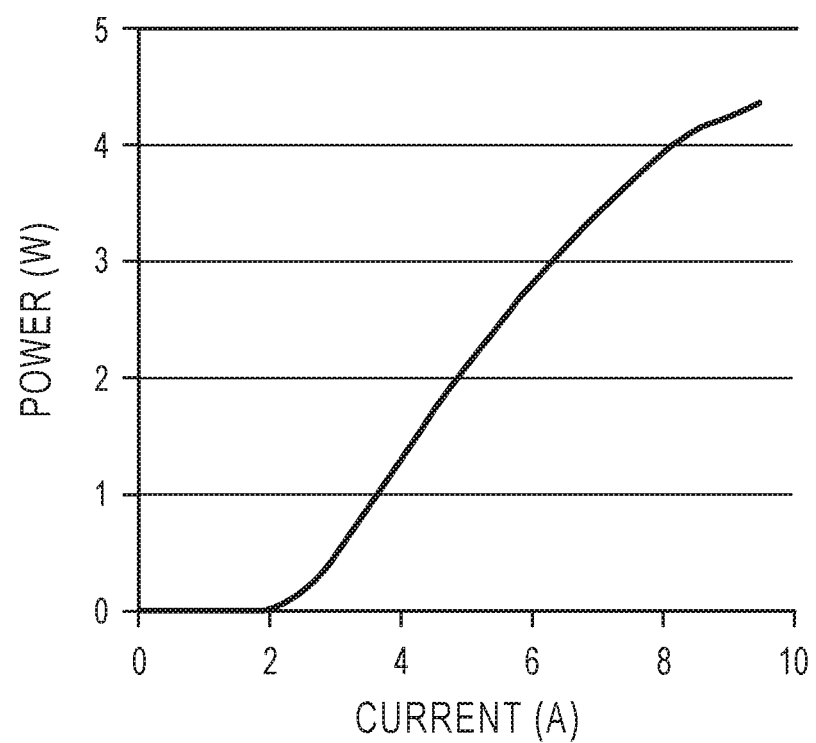
FIG. 9 is a diagram of illustrating performance of a laser bar having multiple emitters according to certain embodiments

FIG. 9 is a graph illustrating performance of a laser bar according to certain embodiments. As shown in FIG. 9, at currents of 2 Amps and higher, the power output of the laser bar is substantially linear with the current input. The laser bar is characterized by a 25° C. emission spectrum peaking at 450 nm, with a spectral width (also referred to as FWHM) of about 5 nm, and the output angle is 15×20 degrees FWHM with less than 1 μm smile. Lasers having a spectral width of 5 nm are useful in many applications, such as in projectors, where relatively large spectral width (e.g., greater than 4 nm of typical laser) helps reduces speckle.

Figure 10A:
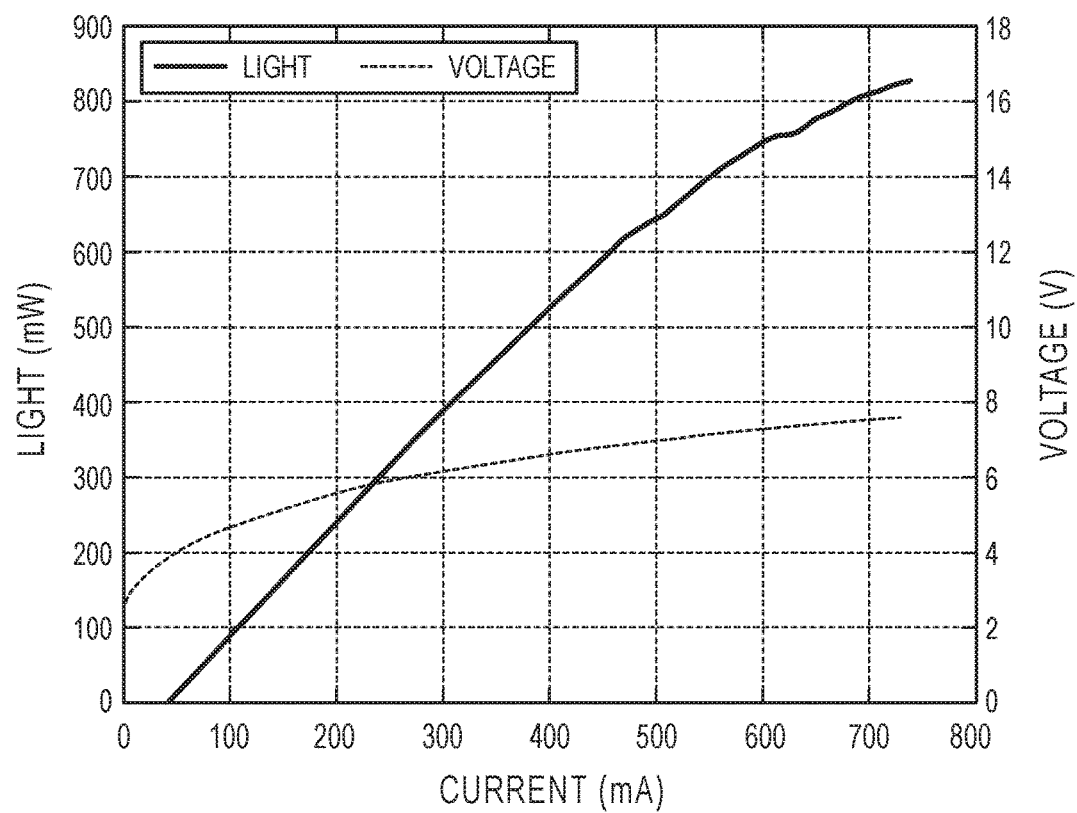
FIG. 10A is a diagram illustrating performance of a blue laser bar according to certain embodiments.

FIG. 10A is a diagram illustrating performance of a single emitter type blue laser according to certain embodiments. This diagram shows performance characteristics for a single blue laser emitter that could serve as the building block for a laser array or laser bar. The blue laser used to generate the results presented in FIG. 10A include single emitter and has a front facet oriented in +c direction, with no optical coating on the front facet. In operation, the front facet of the blue laser does not suffer from catastrophic facet damage. As shown in FIG. OA, the solid line in the graph represents the light output, and the dashed line represents voltage level. The wavelength of the output from the blue laser was about 448 nm. The sloping efficient was about 1.55 W/A.

Figure 10B:
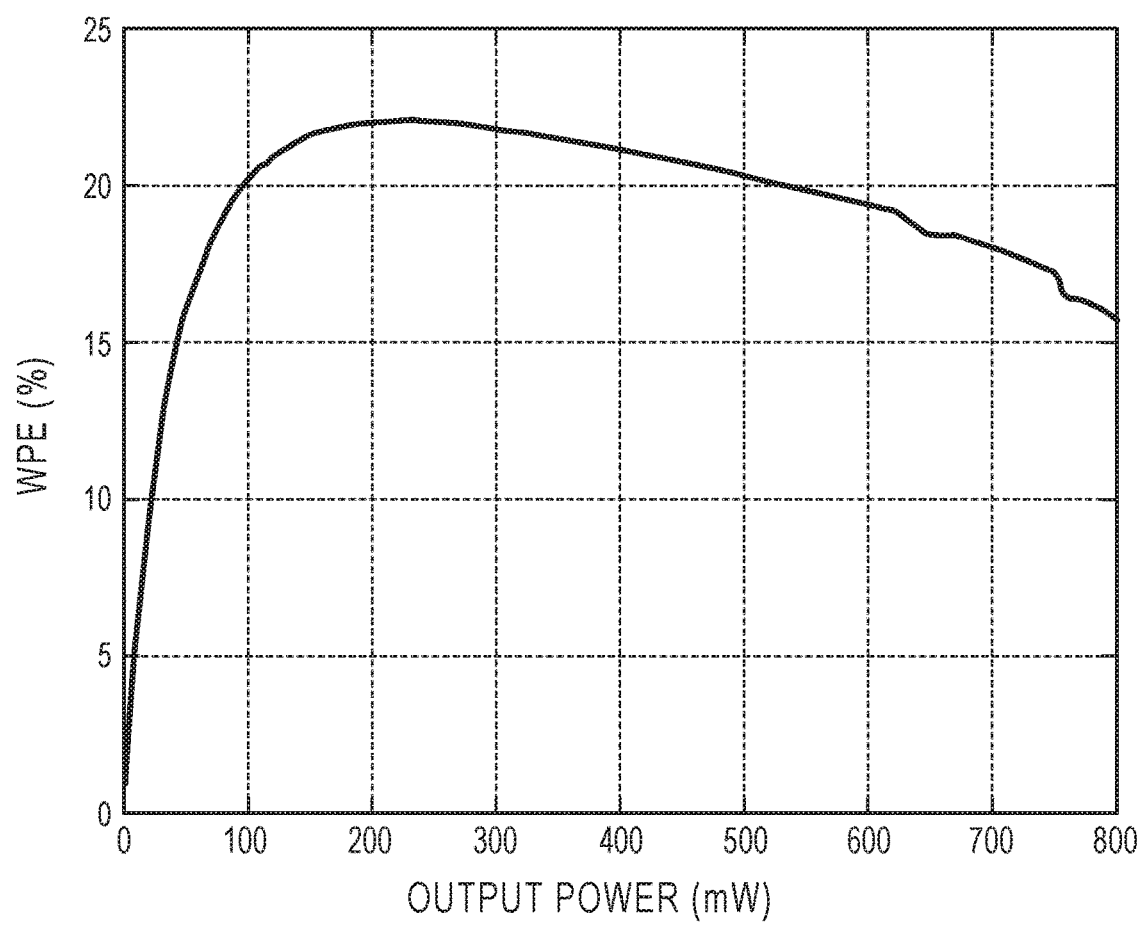
FIG. 10B is a diagram illustrating efficiency of the blue laser bar according to certain embodiments.

FIG. 10B is a diagram illustrating the wall plug efficiency of the single emitter blue laser of FIG. 10A. As illustrated in FIG. 10B, the wall-plug efficiency (WPE) increases with output power and at an output power of about 200 mW peaks at about 22%.

Figure 11:
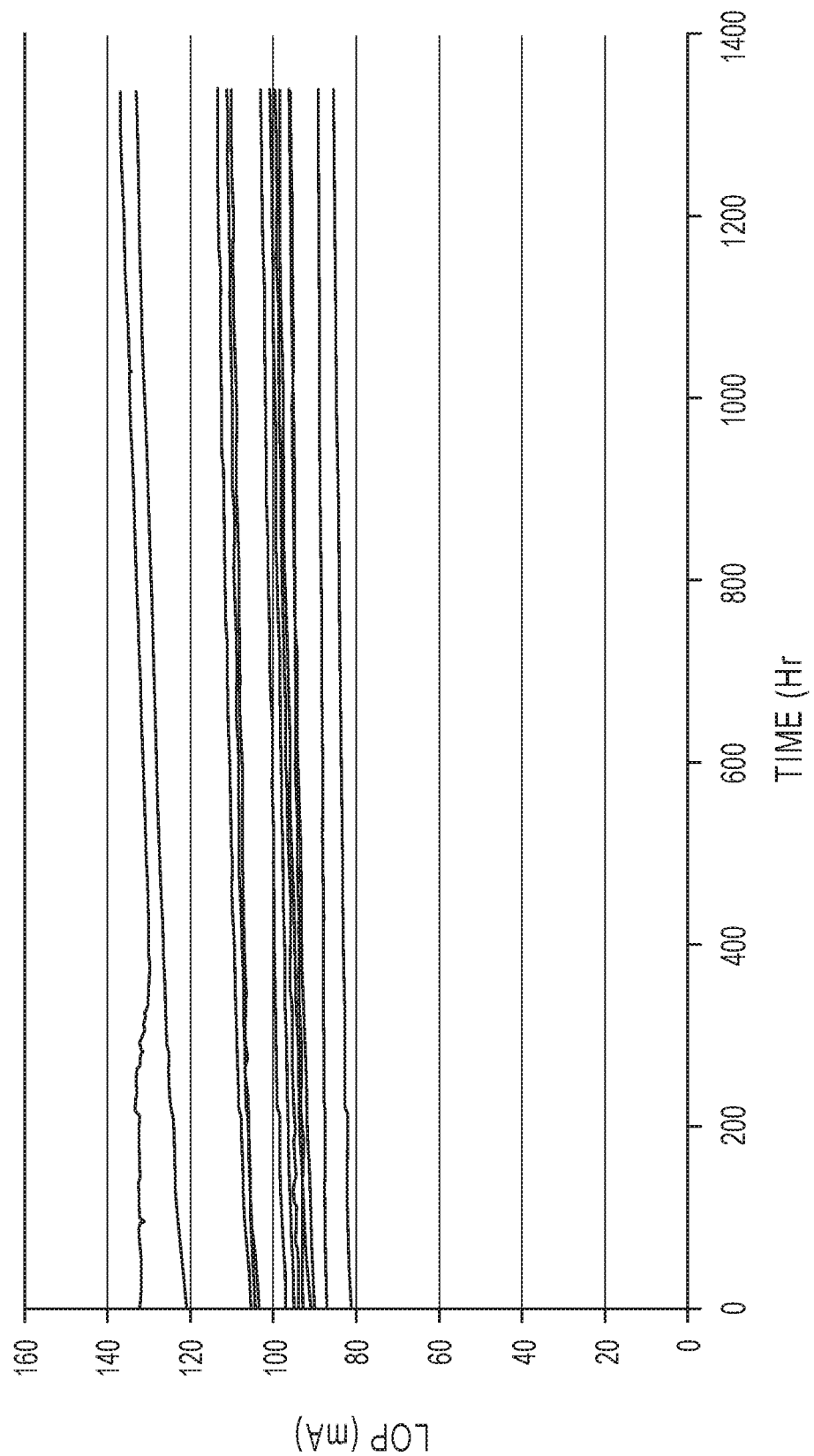
FIG. 11 is a graph illustrating performance of laser bars packaged in a TO38 package according to certain embodiments.

Depending on the packaging methods, reliability and performance of the laser will vary. FIG. 11 is a graph illustrating the reliability performance of single emitter blue lasers mounted in TO38 packages. This diagram plots the operating current required to maintain 85 mW of output power in the laser diodes. The lasers used to generate the data in FIG. 11 have no optical coating on the front facet and are oriented with the front facet in the +c direction. The cladding regions are free from aluminum bearing species to prevent oxidation and/or degradation in an open package configuration. As can be seen from the graph, performance of the laser bar does not substantially change much during the 1400 hours of the testing period. By defining the lifetime as the time it takes for the operating current to increase by 20%, the projected lifetimes of these single emitter blue lasers can be calculated. The mean life of these laser bars is projected to be over 6000 hours.

Figure 12:
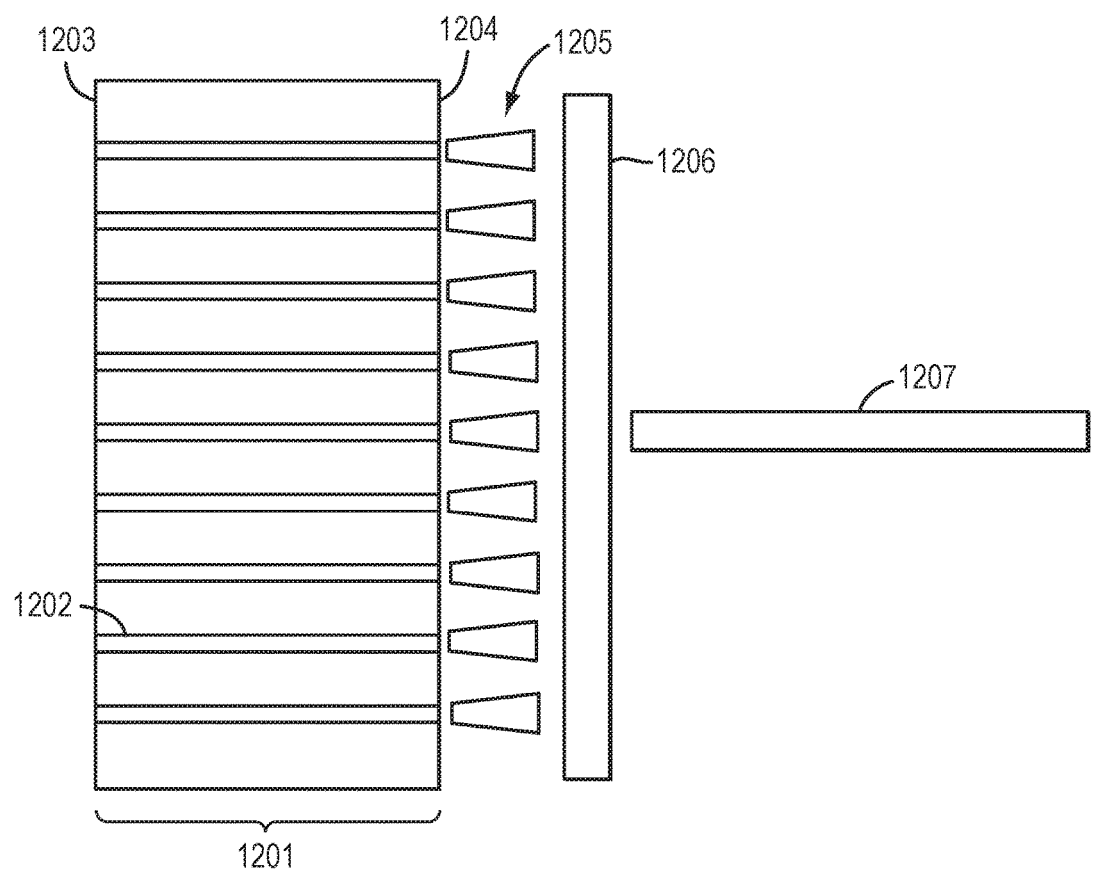
FIG. 12 is a diagram illustrating a blue laser bar with a beam combiner according to certain embodiments.

FIG. 12 is a diagram illustrating a blue laser bar with a beam combiner according to certain embodiments. As shown in FIG. 12, laser bar 1201, as viewed from the top, comprises a front facet 1204 and a back facet 1203. There are a number of emitters 1202 arranged in a substantially parallel manner on the top of the laser bar 1201. A beam combiner 1206, which can be implemented using a collimator optic, is positioned in front the front facet 1204 of the laser bar 1201. The beam combiner 1206 combines laser beams 1205 from then emitters 1202 and outputs a single combined laser beam 1207. The laser beam 1207 can be blue color, but other colors are possible as well.

Figure 13:
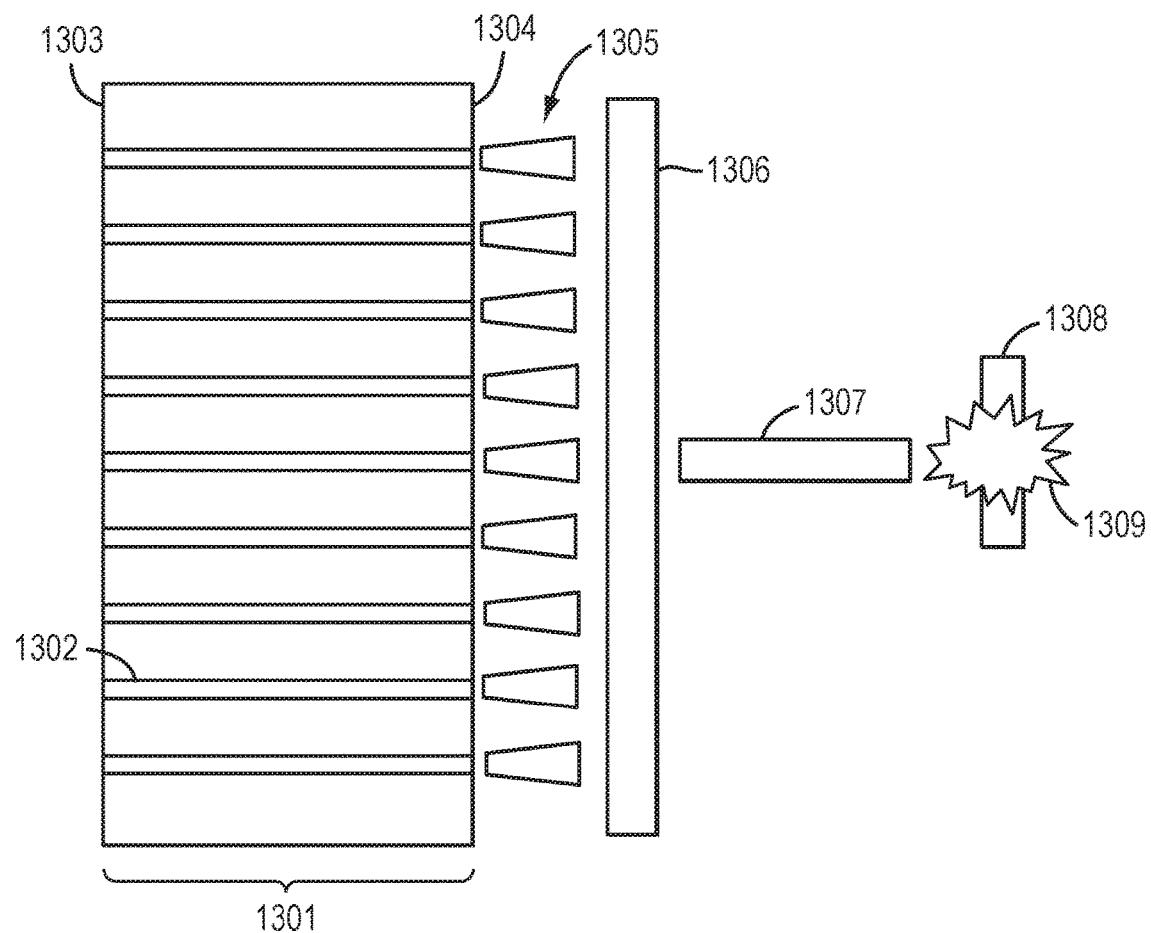
FIG. 13 is a diagram illustrating a multi-emitter laser bar package according to certain embodiments.

FIG. 13 is a diagram illustrating a multi-emitter laser bar package. As shown in FIG. 13, a laser bar 1301, as viewed from the top, comprises a front facet 1304 and a back facet 1303. Blue emitters 1302 are arranged in parallel on the top of the laser bar 1301. As described above, the front facet 1304 of the laser bar 1301 can be free from optical coatings to allow laser beams 1305 to be emitted from the emitters 1302. A beam combiner 1306, which can be implemented using a collimator optic, is positioned in front the front facet 1304 of the laser bar 1301. The beam combiner 1306 combines laser beams 1305 from the n emitters and outputs a single combined laser beam 1307. The combined output 1307 is directed to a green phosphor material 1308, which converts the blue laser output to green light 1309. Depending on the application, lasers in other colors may be used for exciting phosphor material to produce light. For example, lasers operating in the violet wavelength range can be used to excite red, blue, and/or green phosphor to generate light in desired colors.

Figure 14:
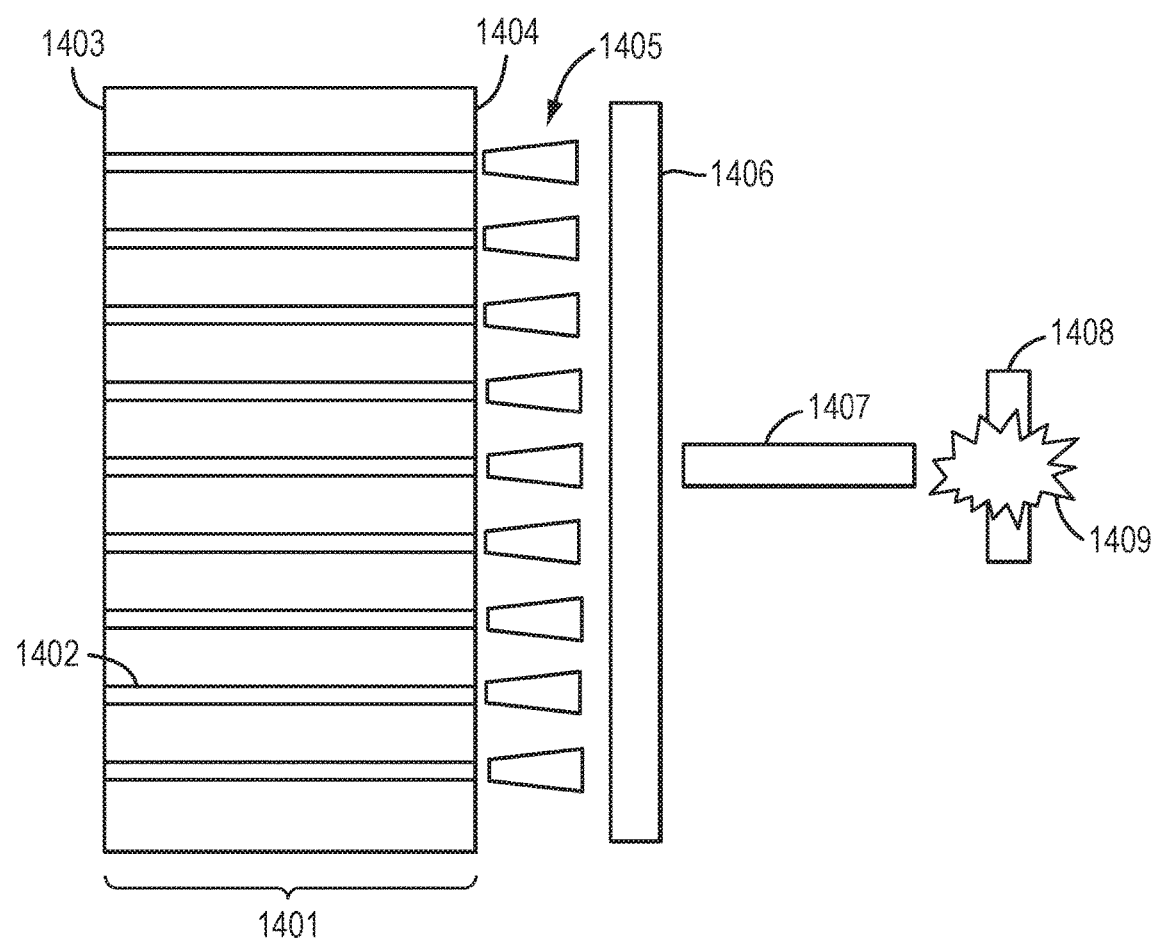
FIG. 14 is a diagram illustrating a multi-emitter laser bar package according to certain embodiments.

FIG. 14 is a diagram illustrating a multi-emitter laser bar package. As described above, laser emitters 1402 can be configured to emit laser beams 1405 in one or more desired colors, such as red, green, blue, violet, and others. The front facet 1404 of the laser bar 1401 can be substantially free from optical coatings to allow laser beams 1405 to be emitted from the emitters. In certain embodiments, the back facet 1403 has a reflective coating. A beam combiner 1406, which can be implemented using a collimator optic or other device, is positioned in front the front facet 1404 of the laser bar 1401. The beam combiner 1406 combines laser beams 1405 from the n emitters 1402 and outputs a single combined laser beam 1407. The combined output 1407 is directed to a phosphor material 1408, which converts the combined laser beam output 1407 to light in a desired color 1409. As an example, the converted light can be used for illumination purposes. For example, the converted light can be substantially a white light.

Figure 15:
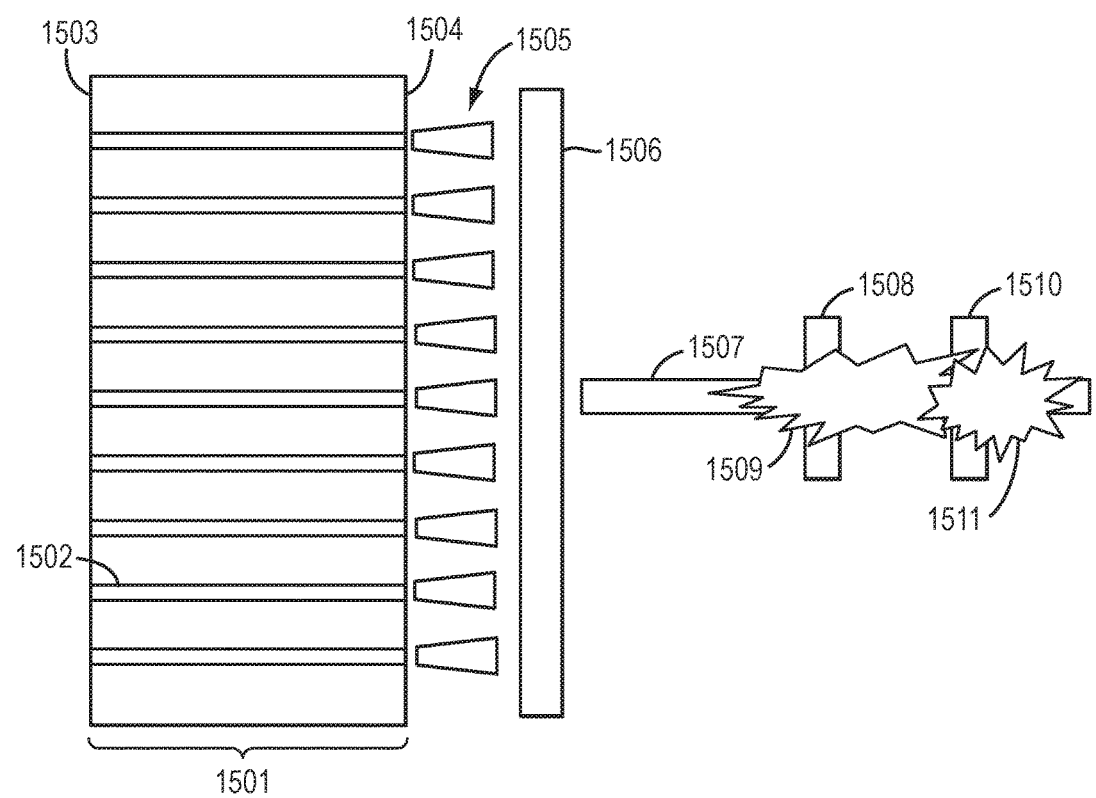
FIG. 15 is a diagram illustrating a multi-emitter laser bar package with two phosphors according to certain embodiments.

FIG. 15 is a simplified diagram illustrating a multi-emitter laser bar package with two phosphors according to certain embodiments. FIG. 15 shows laser bar 1501 having a plurality of emitters 1502, where each of the emitters 1502 has a front facet 1504 and a back facet 1503. Here, the beam combiner 1506 combines laser beams 1505 from the emitters 1502 and outputs a combined laser beam 1507. The combined blue laser beam 1507 is directed to a green phosphor material 1508 to emit green light 1509 and to a red phosphor material 1510 to emit red light 1511. By subjecting a blue laser beam to green and red phosphor material, the blue laser beam can be converted to a white light, which can be used for general lighting purposes or in other configurations such as full color displays with red, green, and blue sources. Alternatively, a violet laser beam can be converted with blue, green, and red phosphors.

Figure 16:
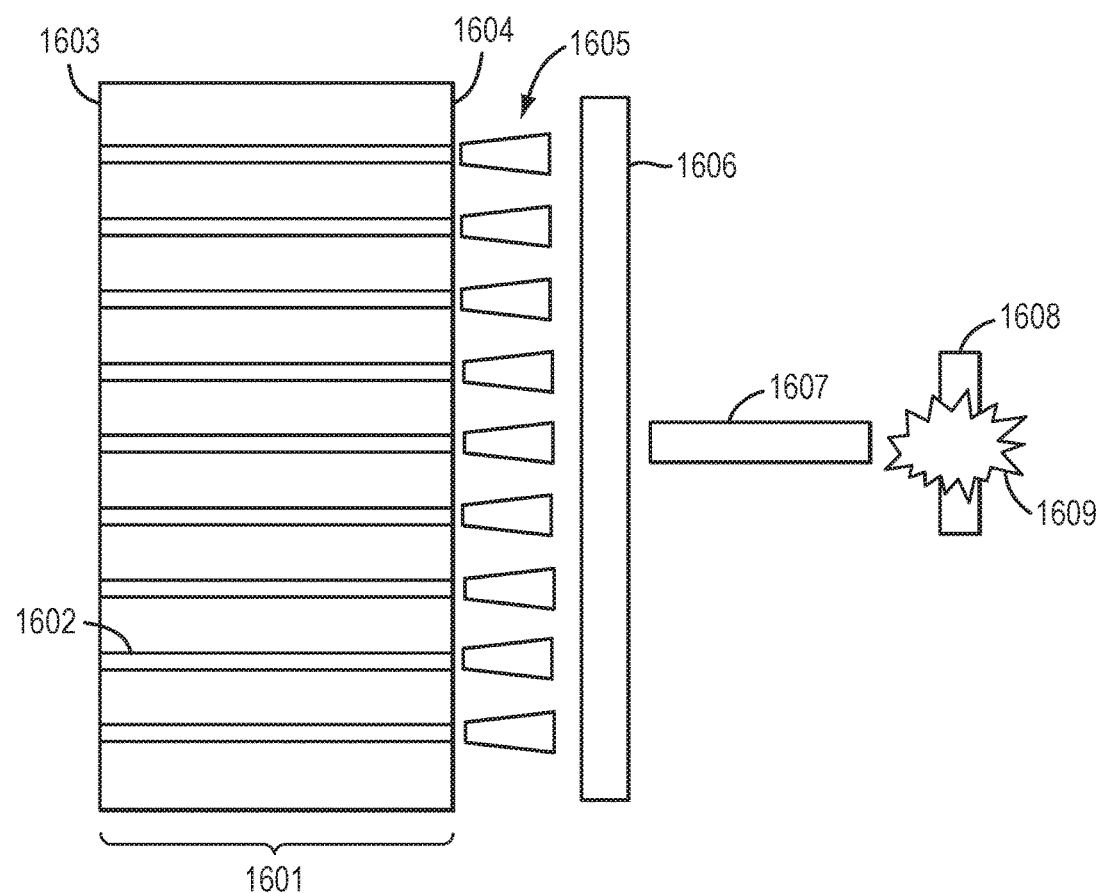
FIG. 16 is a diagram illustrating a multi-emitter laser bar packaged with color wheel according to certain embodiments.

FIG. 16 is a diagram illustrating a multi-emitter laser bar packaged with a color wheel. FIG. 16 shows laser bar 1601 having a plurality of emitters 1602, where each of the emitters 1602 has a front facet 1604 and a back facet 1603. Beam combiner 1606 combines laser beams 1605 from the emitters 1602 and outputs a combined laser beam 1607. As shown in FIG. 16 the combined laser beam 1607 is directed to phosphor wheel 1608 with phosphors for converting the laser beam to a desired output wavelength 1609, enabling full color displays. The color wheel can be rotated to cool the thermal energy from the laser beam, while shifting the wavelength of the emitted laser radiation.

Figure 17A:
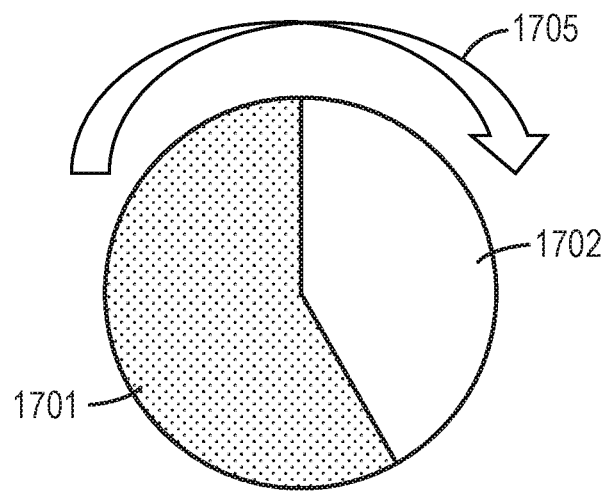
FIGS. 17A, 17B, and 17C are diagrams illustrating phosphor color wheels according to certain embodiments.
Figure 17B:
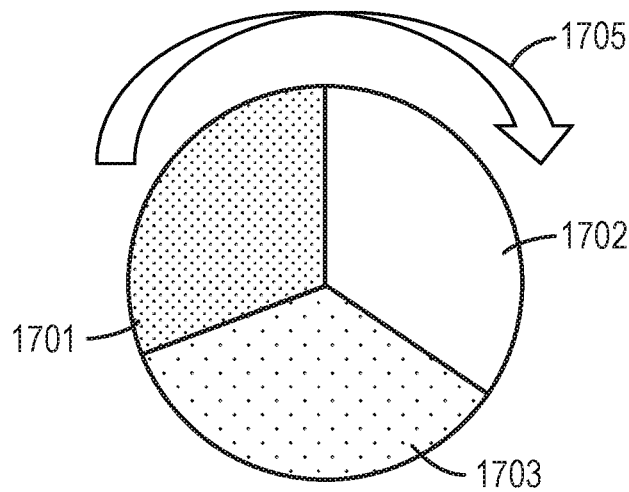
Figure 17C:
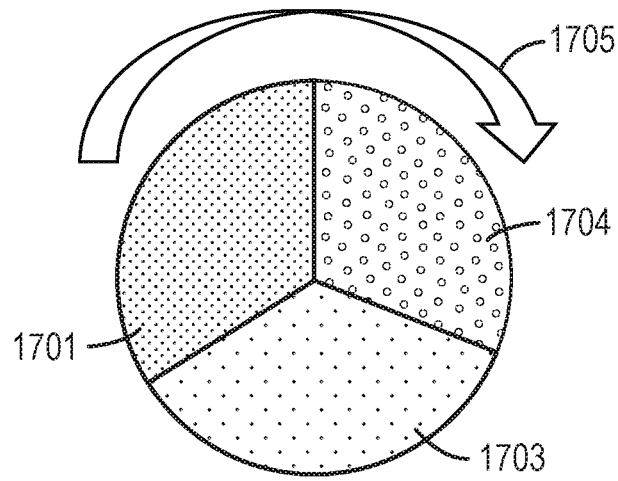

FIG. 17A-C are diagrams illustrating phosphor color wheels according to certain embodiments. FIG. 17A shows a color wheel having a green phosphor section 1701 and a transparent section 1702. Depending on the need, the fill factor can be 10% to 90%, or others. The pump laser bar for providing the laser beam can provide ultraviolet, violet, and/or blue radiation. During operation, the color wheel rotates 1705 to provide a desired amount of color conversion. FIG. 17B shows a color wheel with red phosphors 1703 and green phosphors 1701. For example, the fill factors of the green and red phosphors can be determined based on a desired color output. The pump laser bar for providing the laser beam can provide ultraviolet, violet, and/or blue radiation. During operation, the color wheel rotates 1705 to provide a desired amount of color conversion. FIG. 17C shows a color wheel with red phosphors 1703, green phosphors 1701, and blue phosphors 1704. The fill factors of the colored phosphors may be determined based on a desired color output. The pump laser bar for providing the laser beam can provide ultraviolet or violet radiation.

As disclosed herein, laser bars packaged with color conversion material (e.g., phosphors) can have a wide range of applications, which include both lighting and projection uses. Laser bars being used for projection purposes are described in U.S. Publication No. 2010/0302464, which is incorporated by reference hereby for all purposes. For display applications, a laser bar with multiple emitters integrated into a single package helps reduce both cost and size of projectors. In pico-projectors where 24 W of laser emission is needed, using laser bars operating at relatively high voltage (e.g. 6 W per laser bar) is more convenient than using 24 laser diodes that operate at 1 W each.

Figure 18:
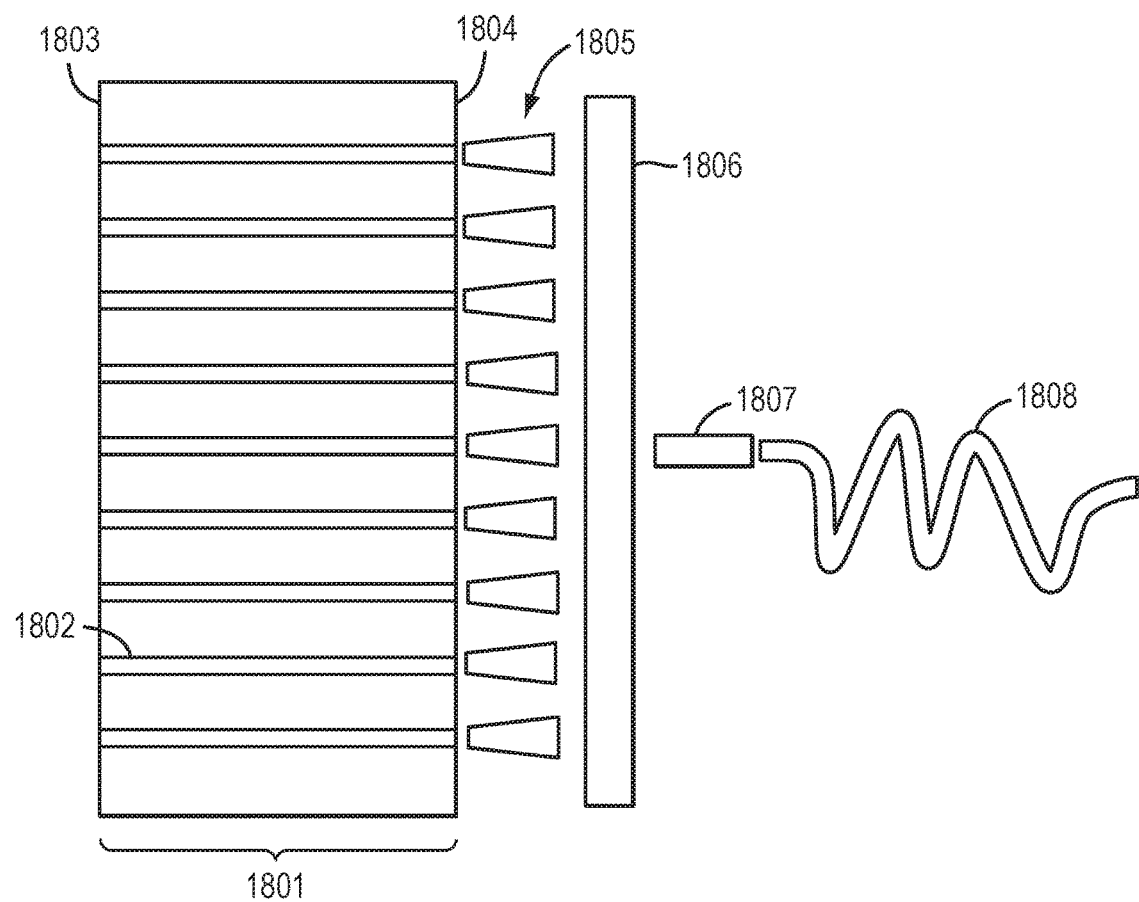
FIG. 18 is a diagram illustrating a multi-emitter laser bar packaged with optical fiber according to certain embodiments.

FIG. 18 is a diagram illustrating a multi-emitter laser bar packaged with an optical fiber according to certain embodiments. FIG. 18 shows laser bar 1801 having a plurality of emitters 1802, where each of the emitters 1802 has a front facet 1804 and a back facet 1803. As shown in FIG. 18 the beam combiner 1806 combines laser beams 1805 from the n emitters 1802 into a combined laser beam 1807 and directs combined laser beam 1807 into an optical fiber 1808. The optical fiber functions as an optical coupling device, which allows for alignment to the individual emitters on the laser bar. It is to be appreciated that because the laser stripes (and emitters thereof) are defined lithographically, their position relative to each other is precise. Thus, it is possible design the alignment optics with all of the laser stripes very accurately. For example, in conventional projection systems based on lasers, it is often required to align 20 to 30 individual lasers. Since each laser is separate, alignment is difficult and thereby increases costs and reduces efficiency due to imperfect alignment reducing optical throughput. Laser bars according to embodiments provided by the present disclosure offer a solution to this problem.

Figure 19:
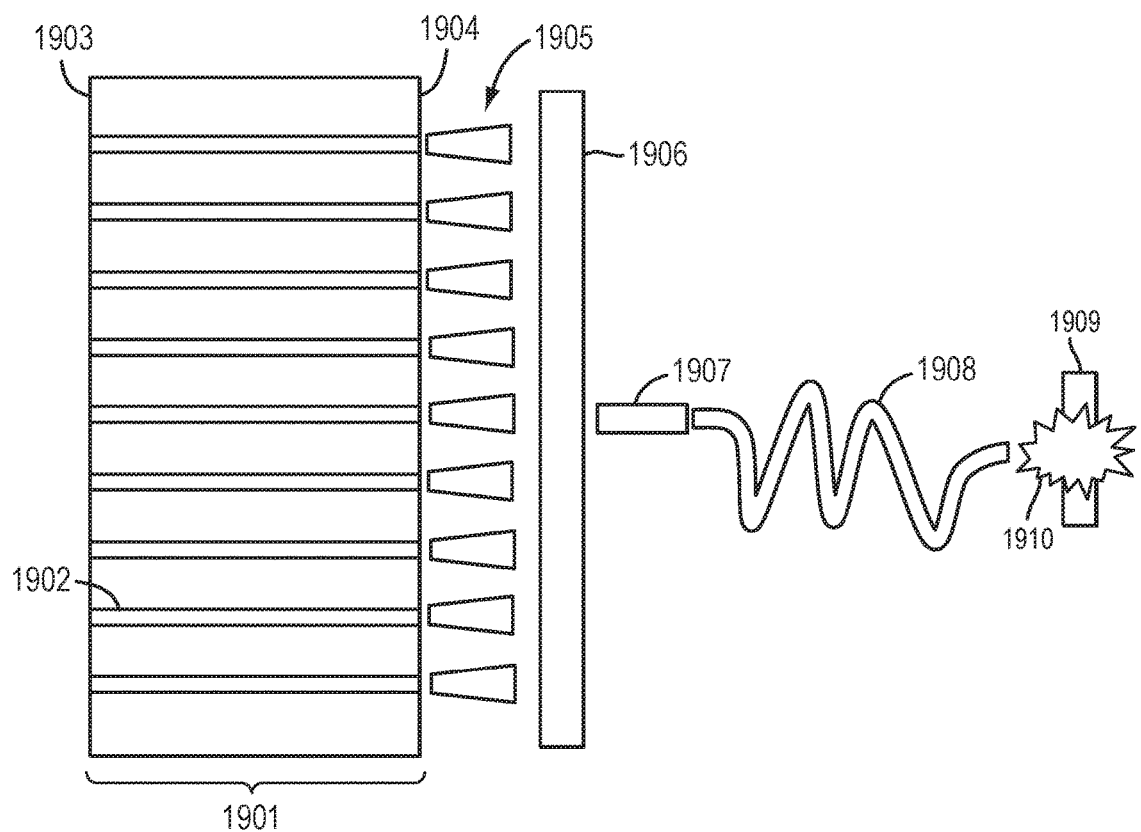
FIG. 19 is a diagram illustrating a multi-emitter laser bar packaged with optical fiber according to certain embodiments.

FIG. 19 is a diagram illustrating a multi-emitter laser bar packaged with optical fiber according to certain embodiments. FIG. 19 shows laser bar 1901 having a plurality of emitters 1902, where each of the emitters 1902 has a front facet 1904 and a back facet 1903. As shown in FIG. 19 the beam combiner 1906 combines laser beams 1905 from the n emitters 1902 into a combined laser beam 1907 and directs combined laser beam 1907 into an optical fiber 1908, which in turn directs the laser beam to a phosphor material 1909. The phosphor material is adapted to convert the laser beam to light in a desirable wavelength range 1910. In certain embodiments, a phosphor wheel is used for color conversion (e.g., as shown in FIG. 17A-C).

Depending on the application, various types of phosphor materials may be used for color conversion. The phosphor materials disclosed herein are wavelength conversion materials, which can be ceramic or semiconductor particle phosphors, ceramic or semiconductor plate phosphors, organic or inorganic downconverters, upconverters (anti-stokes), nanoparticles, and other materials which provide wavelength conversion. Some examples are listed below:

$(Sr,Ca)_{10}(PO_4)_6 * B_2O_3:Eu^{2+}$ (wherein $0<n\hat{~}1$)
$(Ba,Sr,Ca)_5(PO_4)_3(Cl,F,Br,OH):Eu^{2+},Mn^{2+}$
$(Ba,Sr,Ca)BPO_5:Eu^{2+},Mn^{2+}$
$Sr_2Si_3O_8 *_2 SrC_{12}:Eu^{2+}$
$(Ca,Sr,Ba)_3MgSi_2O_8:Eu^{2+}, Mn^{2+}$
$BaAl_8O_{13}:Eu^{2+}$
$2SrO *_{0.84} P2O_5 *_{0.16} B_2O_3:Eu^{2+}$
$(Ba,Sr,Ca)MgA_{110}O_{17}:Eu^{2+},Mn^{2+}$
$K_2SiF_6:Mn^{4+}$
$(Ba,Sr,Ca)Al_2O_4:Eu^{2+}$
$(Y,Gd,Lu,Sc,La)BO_3:Ce^{3+}Tb^{3+}$
$(Ba,Sr,Ca)_2(Mg,Zn)Si_2O_7:Eu^{2+}$
$(Mg,Ca,Sr, Ba,Zn)_2Si1\_xO_4 \ 2x:Eu^{2+}$ (wherein $0<x=0.2$)
$(Sr,Ca,Ba)(Al,Ga,m)_2S_4:Eu^{2+}$
$(Lu,Sc,Y,Tb)2\_u\_vCevCal+uLiwMg_2 \ wPw(Si,Ge)3\_w012\_u/2$ where —O.SSu^1; $0<v£Q.1$; and
$OSw\hat{~}O._2$
$(Ca,Sr)_8(Mg,Zn)(SiO_4)_4Cl_2:Eu^{2+},Mn^{2+}$
$Na_2Gd_2B_2O_7:Ce^{3+},Tb^{3+}$
$(Sr,Ca,Ba,Mg,Zn)_2P2O_7:Eu^{2+}Mn^{2+}$
$(Gd,Y,Lu,La)_2O_3:Eu^{3+},Bi^{3+}$
$(Gd,Y,Lu,La)_2O2S:Eu^{3+},Bi^{3+}$
$(Gd,Y,Lu,La)VO_4:Eu^{3+},Bi^{3+}$
$(Ca,Sr)S:Eu^{2+},Ce^{3+}$

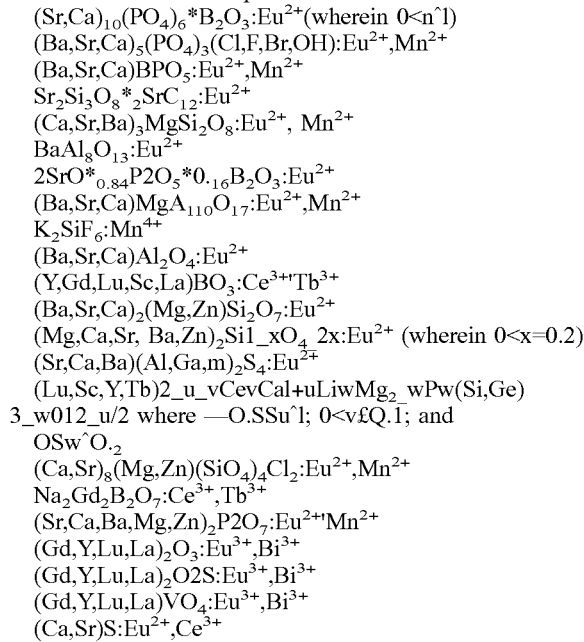

(Y,Gd,Tb,La,Sm,Pr,Lu)$_3$(Sc,Al,Ga)$_{5-n}$O$_{12-3/2n}$:Ce$^{3+}$ (wherein 0˄0˄0.5)

ZnS:Cu+,Cl~
ZnS:Cu+,Al$^{3+}$
ZnS:Ag+,Al$^{3+}$
SrY$_2$S$_4$:Eu$^{2+}$
CaLa$_2$S$_4$:Ce$^{3+}$
(Ba,Sr,Ca)MgP$_2$O$_7$:Eu$^{2+}$'Mn$^{2+}$
(Y,Lu)$_2$WO$_6$:Eu$^{3+}$,Mo$^{6+}$
CaWO$_4$
(Y,Gd,La)$_2$O$_2$S:Eu$^{3+}$
(Y,Gd,La)$_2$O$_3$:Eu$^{3+}$
(Ca,Mg)xSyO:Ce
(Ba,Sr,Ca)nSinNn:Eu$^{2+}$ (wherein 2n+4=3n)
Ca$_3$(SiO$_4$)Cl2:Eu$^{2+}$
ZnS:Ag$^+$,Cl~
(Y,Lu,Gd)$_2$_nCanSi$_4$N$^{6+}$nC1_n:Ce$^{3+}$, (wherein 0˄n˄0.5)
(Lu,Ca,Li,Mg,Y)α-SiAlON doped with Eu$^{2+}$ and/or Ce$^{3+}$
(Ca,Sr,Ba)SiO$_2$N$_2$:Eu$^{2+}$,Ce$^{3+}$
(Sr,Ca)AlSiN$_3$:Eu$^{2+}$
CaAlSi(ON)$_3$:uEu$^{2+}$
Sr$_{10}$(PO$_4$)$_6$C$_{12}$:Eu$^{2+}$
(BaSi)O12N2:Eu$^{2+}$
SrSi$_2$(O,Cl)$_2$N$_2$:Eu$^{2+}$
(Ba,Sr)Si$_2$(O,Cl)2N2:Eu$^{2+}$
LiM$_2$O$_8$:Eu$^{3+}$ where M=(W or Mo)

In other examples, one or more phosphors can be as follows:

(Y,Gd,Tb,La,Sm,Pr,Lu)$_3$(Sc,Al,Ga)$_{5-n}$O$_{12-3/2n}$:Ce$^{3+}$ (wherein 0≤n≤0.5)

ZnS:Cu+,Cl−
(Y,Lu,Th)$_3$Al$_5$O$_{12}$:Ce$^{3+}$
ZnS:Cu+,Al3+
ZnS:Ag+,Al3+
ZnS:Ag+,Cl−
(Ca, Sr) Ga$_2$S$_4$: Eu$^{2+}$
SrY$_2$S$_4$:Eu$^{2+}$
CaLa$_2$S$_4$:Ce$^{3+}$
(Ba,Sr,Ca)MgP$_2$O$_7$:Eu$^{2+}$,Mn$^{2+}$
(Y,Lu)$_2$WO$_6$:Eu$^{3+}$,Mo$^{6+}$
CaWO$_4$
(Y,Gd,La)$_2$O$_2$S:Eu$^{3+}$
(Y,Gd,La)$_2$O$_3$:Eu$^{3+}$
(Ba,Sr,Ca)$_n$Si$_n$N$_n$:Eu$^{2+}$ (where 2n+4=3n)
Ca$_3$(SiO$_4$)Cl$_2$:Eu$^{2+}$
(Y,Lu,Gd)$_{2-n}$Ca$_n$Si$_4$N$_{6+}$:C$_{in}$:Ce$^{3+}$, (wherein 0≤n≤0.5)
(Lu,Ca,Li,Mg,Y) alpha-SiAlON doped with Eu$^{2+}$ and/or Ce$^{3+}$
(Ca,Sr,Ba)SiO$_2$N$_2$:Eu$^{2+}$,Ce$^{3+}$
(Sr,Ca)AlSiN$_3$:Eu$^{2+}$
CaAlSi(ON)$_3$:Eu$^{2+}$
Sr$_{10}$(PO$_4$)$_6$Cl$_2$:Eu$^{2+}$
(BaSi)O$_{12}$N$_2$:Eu$^{2+}$
M(II)$_a$Si$_b$O$_c$N$_d$Ce:A wherein (6<a<8, 8<b<14, 13<c<17, 5<d<9, 0<e<2) and M(II) is a divalent cation of (Be,Mg,Ca,Sr,Ba,Cu,Co,Ni,Pd,Tm,Cd) and A of (Ce,Pr,Nd,Sm,Eu,Gd,Tb,Dy,Ho,Er,Tm,Yb,Lu,Mn,Bi,Sb)
SrSi$_2$(O,Cl)$_2$N$_2$:Eu$^{2+}$
(Ba,Sr)Si$_2$(O,Cl)$_2$N$_2$:Eu$^{2+}$
LiM$_2$O$_8$:Eu$^{3+}$ where M=(W or Mo)

For purposes of the present disclosure, it is understood that when a phosphor has two or more dopant ions (i.e. those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation.

FIG. 8 is a simplified diagram illustrating a laser bar having a patterned bonding substrate according to certain embodiments. As shown, laser devices are characterized by a width of about 30 μm. Depending on the application, other widths are possible as well. Laser emitters having pitches smaller than about 90 μm are difficult to connect with wire bonds. In certain embodiments, a patterned bonding substrate is used for forming contacts. For example, the pattern bonding substrates allows for the width to be as low as 10 μm to-30 μm.

In certain embodiments, methods and apparatus include a packaged device or enclosure for multiple emitters. Each of the devices can be configured on a single ceramic or multiple chips on a ceramic, which are disposed on a common heat sink. As shown, the package includes all free optics coupling, collimators, mirrors, spatially or polarization multiplexed for free space output or refocused in a fiber or other waveguide medium. As an example, the package has a low profile and may include a flat pack ceramic multilayer or a single layer. The layer may include a copper base, a copper tungsten base such as a butterfly package or me be a covered CT mount, Q-mount, or others. In certain embodiments, the laser devices are soldered on CTE matched material with low thermal resistance (e.g., AlN, diamond, diamond compound) and form a sub-assembled chip on ceramics. The sub-assembled chip is then assembled together on a second material with low thermal resistance such as copper including, for example, active cooling (i.e., simple water channels or micro channels). In certain embodiments, a sub-assembled chip can be formed directly on the base of a package equipped with all connections such as pins. The flatpack can be equipped with an optical interface such as a window, free space optics, a connector or a fiber to guide the light generated and an environmentally protective cover.

In certain embodiments, the package can be used in a variety of applications. The applications include power scaling (modular possibility) and spectral broadening (select lasers with slight wavelength shift for broader spectral characteristics). The application can also include multicolor monolithic integration such as blue-blue, blue-green, RGB (red-blue-green), and others.

In certain embodiments, the laser devices can be configured on a variety of packages. As an example, the packages include TO9 can, TO56 can, flat package(s), CS-Mount, G-Mount, C-Mount, micro-channel cooled package(s), and others. In other examples, the multiple laser configuration can have a combined operating power of 1.5 Watts, 3, Watts, 6 Watts, 10 Watts, and greater. In certain embodiments, an optical device including multiple emitters, is free from any optical combiners, which can lead to inefficiencies. In other examples, optical combiners may be included and configured with the multiple emitter devices. Additionally, the plurality of laser devices (i.e., emitters) may comprise an array of laser devices configured on a non-polar oriented GaN or a semi-polar oriented GaN or a combination thereof, among others.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and 1 is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 degrees to 80 degrees or 110 degrees to 179.9 degrees from the polar orientation described above towards an (h k l) plane wherein l=0, and at least one of h and k is non-zero). Of course, there can be other variations, modifications, and alternatives.

In other examples, laser devices provided by the present disclosure are operable in an environment comprising at least 150,000 ppm oxygen gas. In certain embodiments, a laser device is substantially free from AlGaN and/or InAlGaN cladding layers. The laser device is substantially free from p-type AlGaN and/or p-type InAlGaN cladding layers. In certain embodiments, each of the emitters comprises a front facet and a rear facet, the front facet being substantially free from coatings. In certain embodiments, each of the emitters comprises a front facet and a rear facet, the rear facet comprising a reflective coating. In other examples, a laser device includes a micro-channel cooler thermally coupled to the substrate. In certain embodiments, a device also has a submount characterized by a coefficient of thermal expansion (CTE) associated with the substrate and a heat sink. In certain embodiments, a submount is coupled to the substrate, and in certain embodiments, a submount is selected from aluminum nitride material, BeO, diamond, composite diamond, and combinations of any of the foregoing. In certain embodiments, the substrate is glued onto a submount, the submount being characterized by a heat conductivity of at least 200 W/(mk). In certain embodiments, the substrate comprises one or more cladding regions. In certain embodiments, the one or more optical members comprise a fast-axis collimation lens. In certain embodiments, the laser device is characterized by a spectral width of at least 4 nm. In certain embodiments, the number N of emitters can range between 3 and 15, 15 and 30, 30 and 50, and in certain embodiments, can be greater than 50. In other examples, each of the N emitters produces an average output power of 25 mW to 50 mW, produces an average output power of 50 to 100 mW, produces an average output power of 100 to 250 mW, produces an average output power of 250 to 500 mW, or produces an average output power of 500 mW to 1000 mW. In a specific example, each of the N emitters produces an average output power greater than 1 W. In an example, each of the N emitters is separated by 3 μm to 15 μm from one another or separated by 15 μm to 75 μm from one another or separated by 75 μm to 150 μm from one another or separated by 150 μm to 300 μm from one another.

In certain embodiments, optical devices such as lasers are disclosed. An optical device includes a gallium and nitrogen containing material having a surface region, which is characterized by a semipolar surface orientation within ±5 degrees of one of the following (10-11), (10-1-1), (20-21), (20-2-1), (30-31), (30-3-1), (40-41), or (40-4-1) or {30-32}, {20-21}, {30-3-1}, or the {30-3-2}. For example, in certain embodiments, the surface region is characterized by a crystallographic orientation selected from a{11-22} plane, a {20-21} plane, a {30-31} plane, a{30-32} plane, a{20-21} plane, a{30-3-1} plane, a {30-3-2} plane, within +/−5 degrees in an a-direction from the a{11-22} plane, within +/−5 degrees in the a-direction from the {20-21} plane, within +/−5 degrees in the a-direction from the {30-31} plane, within +/−5 degrees in the a-direction from the 30-32} plane, within +/−5 degrees in the a-direction from the {20-21} plane, within +/−5 degrees in the a-direction from the {30-3-1} plane, within +/−5 degrees in the a-direction from the {30-3-2} plane, within +/−5 degrees in a c-direction from the {11-22} plane, within +/−5 degrees in the c-direction from the {20-21} plane, within +/−5 degrees in the c-direction from the {30-31} plane, within +/−5 degrees in the c-direction from the 30-32} plane, within +/−5 degrees in the c-direction from the 20-21} plane, within +/−5 degrees in the c-direction from the {30-3-1} plane, and within +/−5 degrees in the c-direction from the {30-3-2} plane. In certain embodiments, a device also has a first waveguide region configured in a first direction, which is a projection of a c-direction overlying the surface region of the gallium and nitrogen containing material. In certain embodiments, a device also has a second waveguide region coupled to the first waveguide region and is configured in a second direction overlying the surface region of the gallium and nitrogen containing material. In certain embodiments, the second direction is different from the first direction and substantially parallel to the a-direction. In certain embodiments, the first and second waveguide regions are continuous, are formed as a single continuous waveguide structure, and are formed together during manufacture of the waveguides. Of course, there can be other variations, modifications, and alternatives.

In certain embodiments, methods and systems disclosed herein have certain benefits and/or advantages. That is, the present laser module-phosphor design approach utilizes a single common package to house a number of laser diode devices (1-30 devices), lenses, and mirrors within a package to produce a single beam of radiation, which is then delivered onto a spot on a phosphor. This approach has several advantages over the individually packaged design approach including reduced cost, improved optical throughput and efficiency, reduced form factor, and increased reliability.

The cost is reduced using this approach because the 1-30 lasers emitters are packaged inside a single package (hermetically sealed or perhaps not), e.g., module. In this example, a package member comprises the plurality of devices coupled to the package member with an aluminum nitride submount, a diamond submount, or a beryllium oxide submount, among others.

Cost is also reduced because the individual lenses can be brought in close proximity to the laser chip enabling the use of small low cost optics throughout the module, and thereby reduce or eliminate the need for active alignment and high precision tooling.

Moreover, the approach uniquely enables lower cost by allowing the use of passively aligned waveguides and/or optical fiber (instead of lenses), which can be brought up in close proximity to the laser chip emitting facet to capture the light from each chip. Because the waveguide and/or optical fiber can be much larger (e.g., 100 μm to 500 μm) than the laser emitter (2 μm to 50 μm) the light from each emitter can be collected without high precision active alignment. Also, because of the excellent mechanical tolerances associated with the positioning of each chip inside the package, monolithic lens, fiber, or waveguide alignment is possible.

Cost is also saved in the assembly process because the beams inside the module can be integrated into a single waveguide or fiber to simplify and reduce the cost of the optical delivery to the phosphor beam. This approach has the benefit of generating a uniform beam at the output side of the module, which maximizes the phosphor pumping process and thereby minimizes or eliminates hot spots and reliability issues. This allows projector manufacturing to more consistent and the performance specifications of a product can be met with greater predictability.

By utilizing a carefully designed fiber or waveguide to aggregate or combine the beams from each emitter, the laser spot coming from the module can be shaped into a variety of spatial patterns such as rectangular patterns, which can match the typical geometry of display generating chips (such as 4:3 and 16:9, among others). This will improve or maximize the optical throughput and efficiency of the projector.

The projector form factor can be reduced because the laser diodes are mounted inside a single flat package, and the package can be mounted directly onto a surface, which can be cooled with fans or other advanced thermal dissipation devices. This can minimize the height of the projector and thereby facilitate achieving a slim profile and compact functionality, which is desired by consumers who value portability.

Also, projector reliability is extended in this design because the edge emitting lasers are mounted directly onto a flat package, the thermal resistance between the active region of the laser diode chip and the case of the module is minimized (1-5° C. per Watt). This design causes the laser active area to operate at low temperatures (10° C. to 30° C. lower), which increases laser efficiency and results in lower costs and increased reliability. In certain embodiments, operating temperatures for the laser module may increase to 70° C., which allows the projectors to operate in hot environments. Depending upon the embodiment, one or more of these benefits may be achieved.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A lighting device comprising:
   a laser bar device comprising:
   a substrate having a surface region containing gallium and nitrogen material;
   a plurality of laser devices arranged in parallel alignment and disposed on the surface region of the substrate, each of the laser devices of the plurality of laser devices being a ridge laser device, wherein every laser device disposed on the surface region of the substrate is one of the laser devices;
   a plurality of emitters, one emitter of the plurality of emitters provided for each of the laser devices, the plurality of emitters being characterized by an average operating power of at least 25 mWatts per emitter, each of the plurality of emitters being characterized by an emission of electromagnetic radiation within a wavelength range of between 395 nm and 425 nm or each of the plurality of emitters being characterized by an emission of electromagnetic radiation within a wavelength range of between 430 nm and 480 nm, and each of the laser devices being characterized by a length and a width;
   a first common electrode electrically coupled to each of the laser devices;
   a second common electrode electrically coupled to the substrate;
   an optical device configured with respect to the laser devices for optically combining electromagnetic radiation from the plurality of emitters; and
   a phosphor material operably coupled to the optical device.

2. The lighting device of claim 1, wherein the laser devices each comprise an active region that is substantially the same as the active region of others of the laser devices.

3. The lighting device of claim 1, wherein the phosphor material is configured to interact with the combined electromagnetic radiation from the plurality of emitters to cause a shift in wavelength of the combined electromagnetic radiation from a first wavelength range to a second wavelength range.

4. The lighting device of claim 1, wherein the laser devices comprise cladding regions having a AlN mol fraction of less than about 2%.

5. The lighting device of claim 1, wherein each of the laser devices is substantially free from a p-type AlGaN cladding region and/or a p-type InAlGaN cladding region.

6. The lighting device of claim 1, wherein each of the plurality of emitters comprises a front facet and a rear facet; and the front facet is substantially free from coatings and the rear facet comprises a reflective coating.

7. The lighting device of claim 1, further comprising:
   a micro-channel cooler thermally coupled to the substrate; and
   a submount coupled to the substrate, wherein the submount is selected from an aluminum nitride submount and a diamond submount.

8. The lighting device of claim 1, wherein each of the plurality of emitters outputs electromagnetic radiation within a blue wavelength range.

9. The lighting device of claim 1, wherein each of the laser devices is oriented substantially in the c-direction.

10. The lighting device of claim 1, wherein each of the laser devices is oriented substantially in the projection of the c-direction; and each of the laser devices comprises a first end comprising a first facet and a second end comprising a second facet.

11. The lighting device of claim 1, wherein the phosphor material is configured to interact with the combined electromagnetic radiation from the plurality of emitters to output substantially white light.

12. The lighting device of claim 1, wherein each of the laser devices comprises a front facet oriented in the projection of the +c-direction.

13. The lighting device of claim 1, wherein the lighting device is contained within a package selected from a hermetically sealed package, an environmentally sealed package, and an open package.

14. The lighting device of claim 1, wherein the surface region is characterized by a crystallographic orientation selected from a c-plane, an m-plane, a{11-22} plane, a {20-21} plane, a {30-31} plane, a{30-32} plane, a{30-3-1} plane, a {30-3-2} plane, within +/−5 degrees in an a-direction from the {11-22} plane, within +/−5 degrees in the a-direction from the {20-21} plane, within +/−5 degrees in the a-direction from the {30-31} plane, within +/−5 degrees in the a-direction from the {30-32} plane, within +/−5 degrees in the a-direction from the {30-3-1} plane, within +/−5 degrees in the a-direction from the {30-3-2} plane, within +/−5 degrees in a c-direction from the {11-22} plane, within +/−5 degrees in the c-direction from the {20-21} plane, within +/−5 degrees in the c-direction from the {30-31} plane, within +/−5 degrees in the c-direction from the {30-32} plane, within +/−5 degrees in the c-direction from the {30-3-1} plane, and within +/−5 degrees in the c-direction from the {30-3-2} plane.

15. The lighting device of claim 1, wherein each of the plurality of emitters is characterized by an output wavelength of about 395 nm to 425 nm; and the combined electromagnetic radiation is characterized by a spectral FWHM of greater than 3 nm.

16. A lighting device comprising:
an array of laser devices having a respective plurality of emitters, the plurality of emitters being configured to be operable within a broad spectral output greater than 3 nm FWHM, each of the plurality of emitters being configured to emit electromagnetic radiation within a wavelength range of between 395 nm and 425 nm or each of the plurality of emitters being configured to emit electromagnetic radiation within a wavelength range of between 430 nm and 480 nm, each of the laser devices comprising a gallium and nitrogen containing material and being formed on a surface region, wherein every laser device formed on the surface region is one of the laser devices, and each of the laser devices include a first facet region and a second facet region comprising a mirror surface;
a common p-side electrode coupling each of the laser devices; and
a common n-side electrode coupling each of the laser devices, the surface region being characterized by a crystallographic orientation selected from a c-plane, an m-plane, a{11-22} plane, a {20-21} plane, a {30-31} plane, a{30-32} plane, a{30-3-1} plane, a {30-3-2} plane, within +/−5 degrees in an a-direction from the {11-22} plane, within +/−5 degrees in the a-direction from the {20-21} plane, within +/−5 degrees in the a-direction from the {30-31} plane, within +/−5 degrees in the a-direction from the {30-32} plane, within +/−5 degrees in the a-direction from the {30-3-1} plane, within +/−5 degrees in the a-direction from the {30-3-2} plane, within +/−5 degrees in a c-direction from the {11-22} plane, within +/−5 degrees in the c-direction from the {20-21} plane, within +/−5 degrees in the c-direction from the {30-31} plane, within +/−5 degrees in the c-direction from the {30-32} plane, within +/−5 degrees in the c-direction from the {30-3-1} plane, within +/−5 degrees in the c-direction from the {30-3-2} plane, and within +/−5 degrees of an off-cut c-plane;
a package member, wherein the array of laser devices are coupled to the package member with a submount; and
one or more combiner devices to operably couple electromagnetic radiation emitted by each of the plurality of emitters to form a single beam; and
a phosphor material operably coupled to the one or more combiner devices.

17. The lighting device of claim 16, wherein the package member is configured to be operable to expose the plurality of emitters to an open environment, wherein the open environment is selected from air and an inert gas; and the laser device is characterized by a mean time to failure of 5000 hours and greater.

18. The lighting device of claim 16, wherein the phosphor material is configured to interact with the single beam from the one or more combiners devices to output substantially white light.

19. A lighting device comprising:
a substrate having a surface region containing gallium and nitrogen material;
at least three laser devices arranged in parallel alignment and overlying the surface region of the substrate, each of the laser devices of the at least three laser devices being a ridge laser device, wherein every laser device disposed on the surface region of the substrate is one of the laser devices;
a plurality of emitters, one emitter of the plurality of emitters provided for each of the laser devices, the plurality of emitters being characterized by an average operating power of at least 25 mWatts per emitter, each of the plurality of emitters being characterized by an emission of electromagnetic radiation at a wavelength that is substantially the same as the wavelength of others of the plurality of emitters;
a first common electrode electrically coupled to each of the plurality of emitters;
a second common electrode electrically coupled to the substrate;
an optical device configured with respect to the laser devices for optically combining emitted electromagnetic radiation from the plurality of emitters; and
a member operably coupled to the optical device and configured for cooling purposes; and
a phosphor material coupled to the optical device.

20. The lighting device of claim 19, wherein the phosphor material is configured to interact with the combined electromagnetic radiation from the plurality of emitters to output substantially white light.

* * * * *